United States Patent [19]
Yoshinaga et al.

[11] Patent Number: 5,764,523
[45] Date of Patent: Jun. 9, 1998

[54] ELECTRONIC WATT-HOUR METER

[75] Inventors: Tooru Yoshinaga; Katuhiko Takahashi, both of Fukuyama; Shinzou Tamai, Amagasaki, all of Japan

[73] Assignee: Mitsubishi Denki Kabushiki Kaisha, Tokyo, Japan

[21] Appl. No.: 295,872

[22] PCT Filed: Jan. 6, 1994

[86] PCT No.: PCT/JP94/00008

§ 371 Date: Nov. 4, 1994

§ 102(e) Date: Nov. 4, 1994

[87] PCT Pub. No.: WO94/16334

PCT Pub. Date: Jul. 21, 1994

[30] Foreign Application Priority Data

| | | | | |
|---|---|---|---|---|
| Jan. 6, 1993 | [JP] | Japan | ................ | 5-000472 |
| Dec. 15, 1993 | [JP] | Japan | ................ | 5-314689 |

[51] Int. Cl.⁶ .................... G01R 21/133; G01R 21/06
[52] U.S. Cl. .................... 364/483; 324/141; 324/142
[58] Field of Search .................... 324/142, 141, 324/103 R, 107, 140 R; 341/143; 364/483, 572, 575, 715.02, 724.04, 574, 464.04, 724.01, 734, 923.1, 923.2, 481

[56] References Cited

U.S. PATENT DOCUMENTS

| | | | |
|---|---|---|---|
| 4,459,546 | 7/1984 | Arrington et al. | 324/142 |
| 4,564,831 | 1/1986 | Wheable | 340/347 |
| 4,672,555 | 6/1987 | Hart et al. | |
| 4,752,731 | 6/1988 | Toda | 324/142 |
| 4,878,185 | 10/1989 | Brand et al. | |
| 4,907,165 | 3/1990 | Toda | 364/483 |
| 4,992,725 | 2/1991 | Komatsu et al. | 324/142 |
| 5,068,818 | 11/1991 | Uramoto et al. | 364/734 |
| 5,081,413 | 1/1992 | Yamada et al. | 324/142 |
| 5,099,195 | 3/1992 | Greer et al. | 324/142 |
| 5,134,578 | 7/1992 | Garverick et al. | 364/752 |
| 5,151,866 | 9/1992 | Glaser et al. | |
| 5,170,115 | 12/1992 | Kashiwabara et al. | 324/142 |
| 5,200,750 | 4/1993 | Fushiki et al. | 341/143 |
| 5,305,004 | 4/1994 | Fattaruso | 341/120 |
| 5,329,282 | 7/1994 | Jackson | 341/143 |
| 5,363,101 | 11/1994 | Veki | 341/143 |
| 5,396,244 | 3/1995 | Engel | 341/143 |
| 5,440,503 | 8/1995 | Maruyama | 364/724.1 |
| 5,448,747 | 9/1995 | Garverick et al. | 395/800 |
| 5,461,641 | 10/1995 | Abbiate et al. | 375/243 |
| 5,471,209 | 11/1995 | Sutterlin et al. | 341/143 |

FOREIGN PATENT DOCUMENTS

| | | |
|---|---|---|
| 0 269 827 | 6/1988 | European Pat. Off. . |
| 0 462 045 | 12/1991 | European Pat. Off. . |
| 62-185174 | 8/1987 | Japan . |
| 3-118483 | 5/1991 | Japan . |
| 5-333067 | 12/1993 | Japan . |
| WO8603302 | 11/1984 | WIPO . |
| WO-86/03302 | 6/1986 | WIPO . |

OTHER PUBLICATIONS

S. Mazor, "Approaching Filters Discretely", Computer Design, vol. 21, No. 4, Apr. 1982 Winchester, Mass. pp. 159–162.

*Primary Examiner*—Emanuel Todd Voeltz
*Assistant Examiner*—Tony M. Cole
*Attorney, Agent, or Firm*—Burns, Doane, Swecker & Mathis, LLP

[57] ABSTRACT

In a method of calculating an electric power by digitalizing a voltage signal and a current signal of an electronic watt-hour meter and multiplying digitalized signals, precision of an electric power calculation is improved by a circuit arrangement suitable for use in an IC mainly composed of a digital circuit with a small analog scale. A voltage signal and a current signal are inputted into analog to digital conversion means composed of a sigma-delta modulation circuit and the like, respectively, and a moving average of outputs from the analog to digital conversion means is determined by moving average processing means as a low-pass filter and then voltages are multiplied by currents. An analog scale for sigma-delta modification is small. Additionally, the circuit arrangement is reduced by the employment of the low-pass filter due to the use of the moving average. Further, an electric power can be calculated with a high precision.

19 Claims, 32 Drawing Sheets

FREQUENCY OF X INPUT SIGNAL (60 Hz)

1

ELECTRONIC WATT-HOUR METER

TECHNICAL FIELD

The present invention relates to an electronic watt-hour meter for converting analog input signals of a voltage and a current into digital values and processing the digital values.

BACKGROUND ART

FIG. 34 shows a block diagram of a circuit for calculating an electric power of a conventional electronic watt-hour meter.

In FIG. 34, numeral 71 denotes a first successively comparing type A/D converter into which an analog current signal is input, numeral 72 denotes a second successively comparing type A/D converter into which an analog voltage signal is input and numeral 73 denotes a multiplier into which digital data corresponding to a voltage value and a current value from the respective successively comparing type A/D converters 71, 72 is input.

As shown in FIG. 34, the conventional electronic watt-hour meter includes the first and second successively comparing type A/D converters 71, 72 as means for converting analog quantities of a voltage and a current into digital values, and an electronic energy w is obtained by calculating these digital outputs by the multiplier 73.

In general, since the successively comparing type A/D converters 71, 72 quantize an analog input signal to a digital value in such a manner that an output is discretely increased with respect to the analog input signal by the same resolution, a successively comparing type A/D converter with high resolution is needed to obtain absolute precision for a low level input.

For example, when a current signal is supposed to be 1/120 of a maximum input, the following condition must be satisfied in order to keep the accuracy of a quantized current value to 0.5% or less.

$$\epsilon = \frac{0.5}{100} \geq \frac{\text{quantizing error}}{(1/120) \text{ (true value)}} \quad (1)$$

A successively comparing type A/D converter has a S/N ratio represented by $$S/N = 6m + 1.8 \text{ (dB)} \quad (2)$$

where m is the number of output bits of the successively comparing type A/D converter when the sampling frequency is $f_2 = 2 \times (\text{signal frequency})$. Thus, a successively comparing type A/D converter having a resolution of m=15 bits is needed to keep the aforesaid precision of 0.5% or less.

On the other hand, as a method of improving the precision, there is a method of increasing a sampling frequency ($f_s$) of a successively comparing type A/D converter, i.e., a so-called over-sampling method.

For example, when a sampling frequency ($f_s$) is increased to a frequency which is 128 times a sampling frequency ($f_2$=twice a signal frequency) determined by the Nyquist theorem, a quantized noise is dispersed to a wide bandwidth and the level of spectrum of each frequency component is lowered. When it is assumed here that a signal frequency=60 Hz and a sampling frequency ($f_s$)=15.36 KHz, an over-sampling of 128 times is achieved and a noise level of the signal frequency component is improved by about 21 dB, which is equivalent to an improvement of a resolution of a successively comparing type A/D converter by 3-4 bits. In this case, a successively comparing type A/D converter having a resolution of 11-12 bits is needed to keep the precision of 0.5% or less of the quantized current value.

Therefore, a successively comparing type A/D converter having a high resolution and a multiplier to which many bits can be input are needed in conventional devices to obtain a high-precision electronic watt-hour meter, by which the circuit arrangement is of increased complexity and increased cost. In particular, this is very disadvantageous when electronic watt-hour meters composed of monolithic ICs are intended to be produced on a large scale.

SUMMARY OF THE INVENTION

An object of the present invention made to solve the above problems is to provide a high-precision electronic watt-hour meter having a simple circuit arrangement.

The electronic watt-hour meter according to a first aspect of the invention comprises first and second analog to digital conversion means for quantizing an AC current and an AC voltage, respectively, first and second moving average processing means for determining a moving average of each of the quantized AC current and the quantized AC voltage, first multiplication means for multiplying the AC current and the AC voltage each subjected to the moving average processing, and cumulation means for cumulating outputs from the multiplication means.

The electronic watt-hour meter according to a fifth aspect of the invention comprises first analog to digital conversion means for quantizing an AC current, second analog to digital conversion means for quantizing an AC voltage, first and second digital low-pass filters for causing the quantized AC current and AC voltage to pass through a low-pass region, respectively, thinning-out means for thinning out the quantized current and the quantized voltage each having been subjected to the low-pass filtration from the sampled value train thereof at a ratio of 1/m (m: a number larger than the number of delay means of the first and second digital low-pass filters), first multiplication means for multiplying an AC current and an AC voltage from the thinning-out means, and cumulation means for cumulating outputs from the multiplication means.

The electronic watt-hour meter according to an eighth aspect of the invention comprises switching means for successively fetching AC currents and AC voltages of respective multiple-element inputs from multiple-input devices from input AC currents and AC voltages of the corresponding elements at a predetermined cycle, first analog to digital conversion means and second analog to digital conversion means for successively quantizing AC currents and AC voltages of the respective multiple-elements from the switching means, first and second digital low-pass filters for causing the quantized AC currents and AC voltages of the respective multiple-elements to successively pass through a low-pass region, thinning-out means for thinning out the quantized currents and the quantized voltages of the respective multiple-elements each having been subjected to the low-pass filtration from the sampled value train thereof at a ratio of 1/m (m: a number larger than the number of delay means of the first and second digital low-pass filters), calculation means for multiplying AC currents and AC voltages which correspond to the multiple-element input and are supplied from the thinning-out means and determining sums of the multiplication results, and cumulation means for cumulating outputs of the sums.

The electronic watt-hour meter according to a twenty-first aspect of the invention comprises switching means for successively switching at a predetermined cycle and outputting respective currents and voltages entered from a first phase, a second phase and a third phase;

first and second analog to digital conversion means for quantizing AC currents and AC voltages of the respective phases output from the switching means, respectively;

first and second digital low-pass filters for causing the quantized AC currents and the quantized AC voltages of the respective phases to pass through a low-pass region, respectively;

thinning-out means for thinning out the quantized AC currents and the quantized AC voltages of the respective phases each having been subjected to the low-pass filtration from the sampled value train thereof at a ratio of 1/m;

calculation means for multiplying the AC currents of the respective phases from the thinning means by the AC voltages of the respective phases from the thinning means, respectively and determining sums of the multiplication results;

third low-pass filter for causing the outputs of the sums to pass through a low-pass region;

cumulating means for cumulating an output from the third digital low-pass filter; as well as at least one of the following adjustment means:

(1) balance adjustment means including first and second balance adjustment registers for multiplying quantized electric power values of a second phase and a third phase determined from an AC current and an AC voltage of a usual object to be measured by balance adjustment value B1, B2, respectively and setting a value $B2=w_{01}/w_{02}$ to the first balance adjustment register and setting a value $B3=W_{01}/w_{03}$ to the second balance adjustment register, where an output from the third digital low-pass filter is represented by $w_{01}$ at the time when a predetermined analog value of the same phase is input as a current-voltage value of the first phase, the analog value is input as a current-voltage value of the second phase and an output from the third digital low-pass filter at the time is represented by $w_{02}$, and the analog value is input as a current-voltage value of the first phase and an output from the third digital low-pass filter at the time is represented by $w_{03}$;

(2) rating adjustment means including a register for cumulating outputs from the third digital low-pass filter and an F value setting register for setting a value $F=(w_{01}/\text{reference electric power})\times(\text{rated reference value})$ (where, reference electric power=value produced in calculation determined by reference voltage·reference current, and rated reference value= value in calculation for determining the number of pulses per unit of electric energy (constant)), and sending an output for measuring an electric energy each time the cumulated value exceeds the F value as well as resetting the register;

(3) light load adjustment means including a light load adjustment register for adding a set light load adjustment value to an output value from the third digital low-pass filter and setting a value $L=(w_{01}/nm)-w_{On}$ in the light load adjustment register as a light load adjustment value, where an output from the digital low-pass filter is represented by $w_{On}$, at the time when a value of 1/n (n≧1), a current analog value input in the (1) is input as a current input of the first phase as well as a value of 1/n (n≧1), and a voltage analog value input in the (1) is input as a voltage input of the second phase; and (4) phase adjustment means including a shift register capable of carrying out the desired number of shifts interposed between the second analog to digital conversion means and the second digital low-pass filter and respective registers P1, P2, P3 for designating the number of shifts of the shift register and carrying out phase adjustment by successively shifting respective phases to values P1, P2, P3 by the shift register in synchronism with the switching means, where an output the third low-pass filter is represented by $w_{oP1}$ at the time when an analog value having the same effective value as that of the analog value of the (1) and a power factor=1 is input as an input of the first phase and a value $P1=K(w_{01}\times 0.5)-w_{oP1}$ (K: constant) is set to the P1 shift register.

an output from the third low-pass filter is represented by $w_{oP2}$ at the time when an analog value having the same effective value as that of the analog value of the (1) and a power factor=1 is input as an input of a second phase and a value $P2=K(w_{01}\times 0.5)-w_{oP2}$ is set to the P1 shift register, and an output from the third low-pass filter is represented by $w_{oP3}$ at the time when an analog value having the same effective value as that of the analog value of the (1) and power factor=1 is input as an input of the second phase and a value $P3=K(w_{01}\times 0.5)\,w_{oP3}$ is set to the P1 shift register.

According to the first aspect of the invention, an AC current and an AC voltage as analog values are quantized by the first and second analog to digital conversion means, the quantized signals are subjected to a moving average processing by the first and second moving average processing means, signals corresponding to the current and voltage, respectively are multiplied by the multiplier to obtain signals corresponding to electric power and the signals are cumulated to obtain a high precision electric energy.

According to the fifth aspect of the invention, an AC current is digitized by the first analog to digital conversion means, an AC voltage is digitized by the second analog to digital conversion means, the digitized AC current and AC voltage are caused to pass through a low-pass region by the first and second low-pass filters, respectively. The AC current and AC voltage having been passed through the low-pass region are thinned out from the sampled value train thereof by the thinning-out means at a ratio of 1/m (m: a number larger than the number of delay means of the first and second digital low-pass filters). The AC current and AC voltage from the thinning-out means are multiplied by the first multiplication means, and outputs from the multiplication means are cumulated by the cumulation means to thereby obtain a high-precision electric energy.

According to the eighth aspect of the invention, AC currents and AC voltages of respective multiple-elements are successively fetched at a predetermined cycle from AC currents and AC voltages of the corresponding multiple-elements input by the switching means, the AC currents and AC voltages of the respective elements from the switching means are successively quantized by the first analog to digital conversion means and the second analog to digital conversion means, caused to successively pass through the low-pass region by the first and second digital low-pass filters, and thinned out by the thinning-out means at a ratio of 1/m (m: a number larger than the number of delay means of the first and second digital low-pass filters), AC currents and AC voltages from the thinning-out means which correspond to the multiple-element inputs are multiplied, respectively, sums of the multiplied results are determined by the calculation means and outputs of the sums are cumulated by the cumulation means to obtain an electric energy.

According to the twenty-first aspect of the invention, respective currents and voltages input from a first phase, a second phase and a third phase are successively switched at a predetermined cycle and output by the switching means, and AC currents and AC voltages of the respective phases are quantized by the first and second analog to digital conversion means, respectively. Next, the quantized AC currents and AC voltages are caused to pass through the low-pass region by the first and second digital low-pass filters, the quantized AC currents and the quantized AC voltages of the respective phases each having been subjected to the low-pass filtration are thinned out by the thinning-out means from the sampled value train thereof at a ratio of 1/m, the AC currents and the AC voltages of the respective phases from the thinning-out means are multiplied, respectively and the sums of the results of multiplication are determined by the calculation means, and outputs of the sums are caused to pass through the low-pass region by the third low-pass filter and cumulated by the cumulation means. At the same, the result of cumulation is adjusted by using at least one of the following adjustment means (1), (2), (3), and (4):

(1) balance adjustment means including first and second balance adjustment registers for multiplying quantized electric power values of a second phase and a third phase determined from an AC current and an AC voltage of a usual object to be measured by balance adjustment value B1, B2, respectively and setting a value B2=$w_{o1}/w_{o2}$ to the first balance adjustment register and setting a value B3=$w_{o1}/w_{o3}$ to the second balance adjustment register, where an output from the third digital low-pass filter is represented by $w_{o1}$, at the time when a predetermined analog value of the same phase is input as a current-voltage value of the first phase, the analog value is input as a current-voltage value of the second phase and an output from the third digital low-pass filter at the time is represented by $w_{o2}$, and the analog value is input as a current-voltage value of the first phase and an output from the third digital low-pass filter at the time is represented by $w_{o3}$;

(2) rating adjustment means including a register for cumulating outputs from the third digital low-pass filter and an F value setting register for setting a value F=($w_{o1}$/reference electric power)×rated reference value (where, reference electric power=value produced in calculation determined by reference voltage-reference current, and rated reference value=value in calculation for determining the number of pulses per unit of electric energy (constant)), and sending an output for measuring an electric energy each time the cumulated value exceeds the F value as well as resetting the register;

(3) light load adjustment means for including a light load adjustment register for adding a set light load adjustment value to an output value from the third digital low-pass filter and setting a value L=($w_{o1}$/nm)−$w_{on}$ to the light load adjustment register as a light load adjustment value, where an output from the digital low-pass filter is represented by $w_{on}$ at the time when a value of 1/n (n≧1) a current analog value input in the (1) is inputted as a current input of the first phase as well as a value of 1/m (m≧1), and a voltage analog value input in the (1) is inputted as a voltage input of the second phase; and (4) phase adjustment means including a shift register capable of carrying out the desired number of shifts interposed between the second analog to digital conversion means and the second digital low-pass filter and respective registers P1, P2, P3 for designating the number of shifts of the shift register and carrying out phase adjustment by successively shifting respective phases to values P1, P2, P3 by the shift register in synchronism with the switching means, where an output from the third low-pass filter is represented by $w_{oP1}$ at the time when an analog value having the same effective value as that of the analog value of the (1) and a power factor=1 is input as an input of the first phase and a value P1=K($w_{o1}$×0.5)−$w_{oP1}$ (K: constant) is set to the P1 shift register, an output from the third low-pass filter is represented by $w_{oP2}$ at the time when an analog value having the same effective value as that of the analog value of the (1) and a power factor=1 is input as an input of a second phase and a value P2=K($w_{o1}$×0.5)−$w_{oP2}$ is set to the P1 shift register, and an output from the third low-pass filter is represented by $w_{oP3}$ at the time when an analog value having the same effective value as that of the analog value of the (1) and power factor=1 is input as an input of the second phase and value P3=K ($w_{o1}$×0.5)−$w_{oP3}$ is set to the P1 shift register.

DETAILED DESCRIPTION OF THE INVENTION

Embodiment 1

Figure 1:
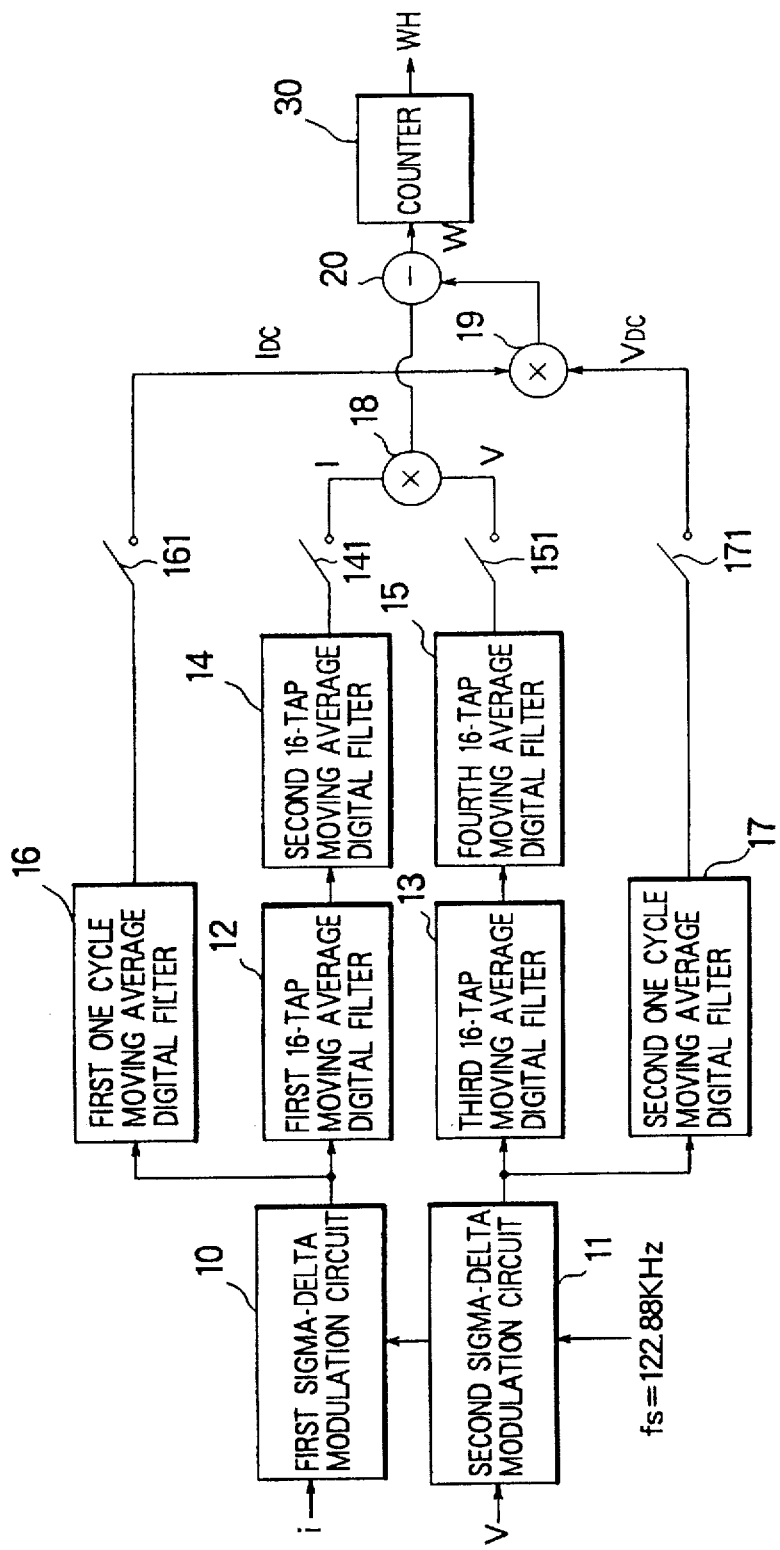
FIG. 1 shows a block diagram of an electric power calculation unit of an electronic watt-hour meter according to an embodiment 1 of the present invention.

An embodiment of the present invention will be described below with reference to the drawings. In FIG. 1, numeral 10 denotes a first sigma-delta modulation circuit to which an analog current signal i is input and numeral 11 denotes a second sigma-delta modulation circuit to which an analog voltage signal v is input. Numeral 12 denotes a first 16-tap moving average digital filter for determining a moving average at 16 points (hereinafter, referred to as 16 taps) of an output from the first sigma-delta modulation circuit 16. Numeral 14 denotes a second 16-tap moving average digital filter connected to the first moving average digital filter 12, numeral 13 denotes a third 16-tap moving average digital filter for determining a moving average at 16 taps of an output from the second sigma-delta modulation circuit 11, numeral 15 denotes a fourth 16-tap moving average digital filter connected to the third 16-tap moving average digital filter 13. First moving average processing means is composed of the first and second 16-tap moving average digital filters 12, 14 and second moving average processing means is composed of the third and fourth 16-tap moving average digital filters 13, 15.

Numeral 16 denotes a first one cycle moving average digital filter connected in parallel with the first 16-tap moving average digital filter 12. Numeral 17 denotes a second one cycle moving average digital filter connected in parallel with the third 16-tap moving average digital filter 13. First and second integration means are composed of the first and second one cycle moving average digital filters 16, 17. Numeral 18 denotes a first multiplier to which only one piece of data is input which is thinned out through ⅛ thinning-out means 141, 151 from respective eight pieces of data output from the second and fourth 16-tap moving average digital filters 14, 15. Numeral 19 denotes a second multiplier to which only one piece of data is input which is thinned out through ⅛ thinning-out means 161, 171 from respective eight pieces of data output from the first and second one cycle moving average digital filters 16, 17. Numeral 20 denotes a subtracter which calculates a difference between an output from the first multiplier 18 and an output from the second multiplier 19 to calculate electric power data w. Numeral 30 denotes a counter for integrating the electric power data.

Figure 2:
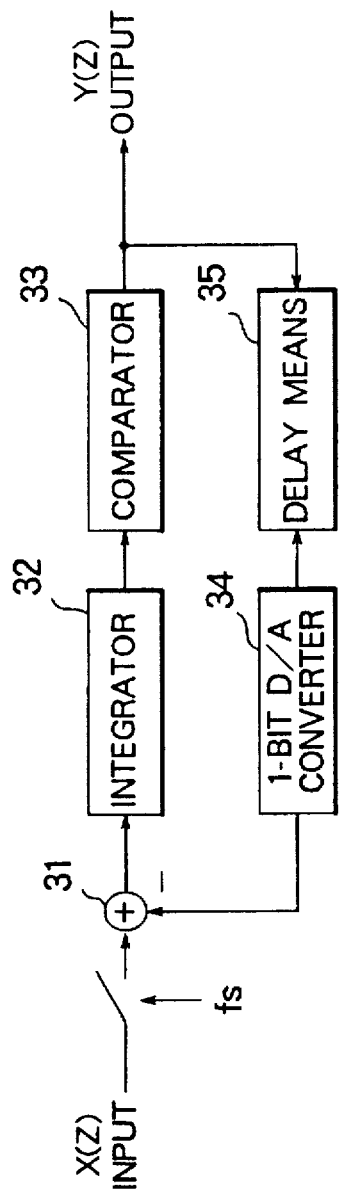
FIG. 2 shows a block diagram of a primary sigma-delta modulation circuit by way of example.

FIG. 2 shows an internal arrangement of a primary sigma-delta modulation circuit constituting the first and second sigma-delta modulation circuits 10, 11 in FIG. 1.

In FIG. 2, an input X(z) is input into an adder 31 in a unit of a sampling frequency ($f_s$). An output from the adder 31 is supplied to an integrator 32 and an output from the integrator 32 is output from a comparator 33 as 1-bit logic data Y(z). The output data is fed back to the adder 31 by a one bit D/A converter 34 through delay means 35. The above arrangement is referred to as the primary sigma-delta modulation circuit.

The primary sigma-delta modulation circuit shown in FIG. 2 has an input/output relation expressed by the following formula (3).

$$Y(z)=X(z)+(1-Z^{-1})Q(z) \qquad (3)$$

where Q(z) is a noise produced by quantization.

As shown in formula (3), a sigma-delta modulated input signal X(z) appears at an output Y(z) as it is and is further added with a noise Q(z) to form an output data.

Figure 3:
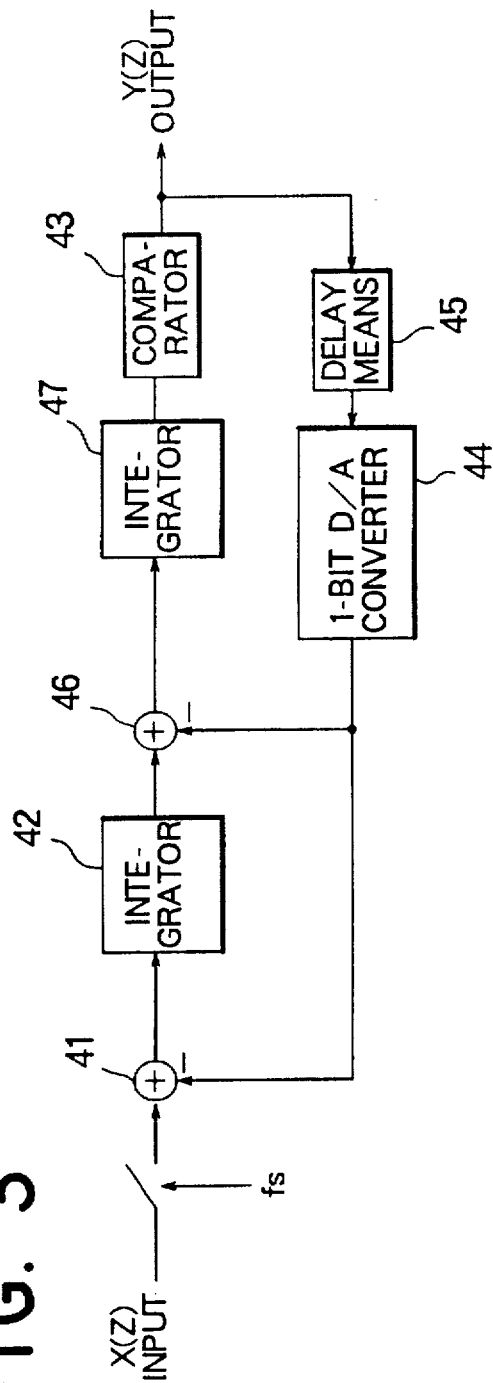
FIG. 3 shows a block diagram of a secondary sigma-delta modulation circuit by way of example.

Although the aforesaid is an example of the primary sigma-delta modulation circuit, a secondary sigma-delta modulation circuit shown in FIG. 3 may constitute the first and second sigma-delta modulation circuits 10, 11 shown in FIG. 1. In the case of the secondary sigma-delta modulation circuit shown in FIG. 3, adders 41, 46 and integrators 42, 47 are arranged as two stages, respectively and other components are the same as those shown in the primary sigma-delta modulation circuit shown in FIG. 2.

The secondary sigma-delta modulation circuit shown in FIG. 3 has an input/output relation expressed by the following formula (4).

$$Y(z)=X(z)+(1-Z^{-1})^2 Q(z) \qquad (4)$$

where Q(z) is a noise produced by quantization.

An input signal X(z) appears at an output Y(z) as it is similar to the primary sigma-delta modulation circuit also in the formula (4) and is further added with a noise Q(z) to form an output data. The formula (3) is different from the formula (4) only in a distribution of a quantized noise caused by the noise (Q(z)) shown in the second term of the respective formulas.

Figure 4:
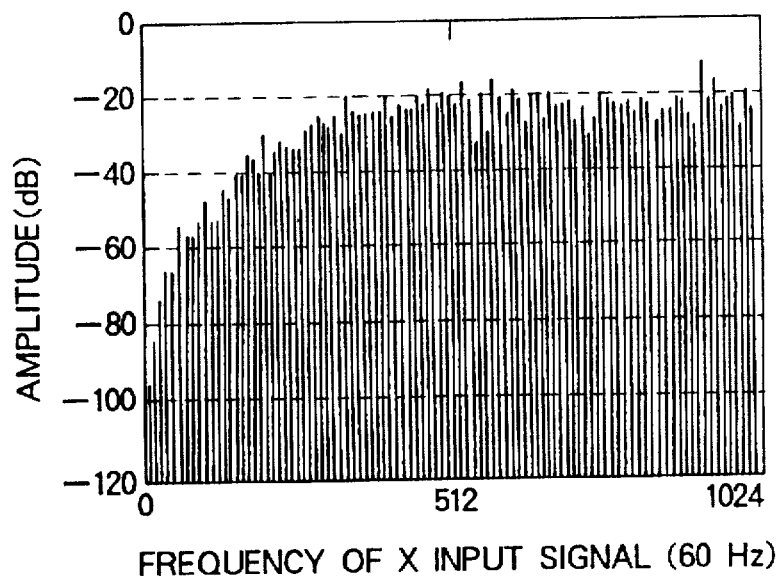
FIG. 4 is a graph showing a distribution of quantized noise spectrum of the secondary sigma-delta modulation circuit by way of example.

FIG. 4 shows a distribution of spectrum of a quantized noise caused by a modulating operation of the secondary sigma-delta modulation circuit. As shown in FIG. 4, a low frequency region has a small amount of a quantized noise and a high frequency region has a large amount of quantized noise. Although the aforesaid primary sigma-delta modulation circuit shown in FIG. 2 also shows a similar distribution of a quantized noise, the secondary sigma-delta modulation circuit of FIG. 3 has a feature that the low frequency region has a smaller amount of a quantized noise.

Thus, in the embodiment I of the present invention in FIG. 1, operation will be described supposing that the sampling frequency is fs=122.88 KHz and the secondary sigma-delta modulation circuit shown in FIG. 3 is used as the first and second sigma-delta modulation circuits 10, 11.

Figure 5:
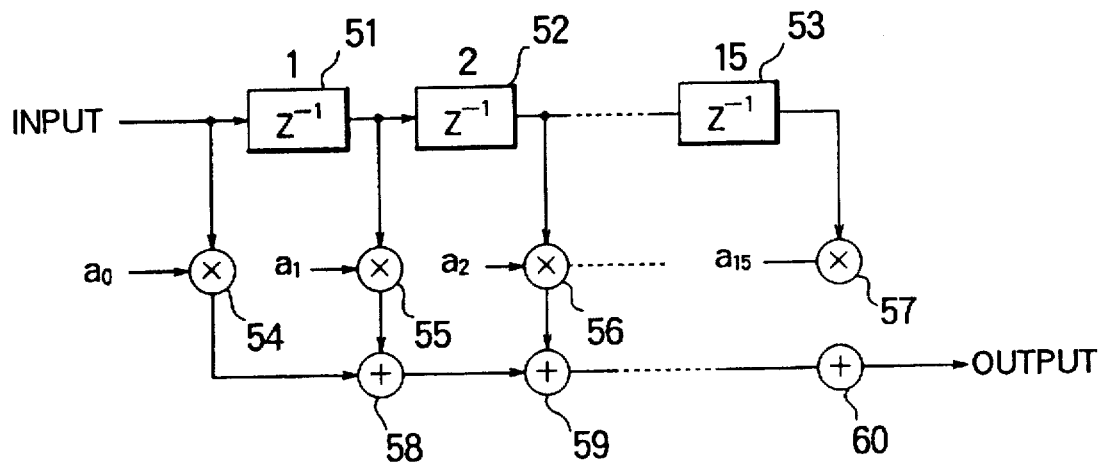
FIG. 5 shows a block diagram of a digital filter constituting a low-pass filter by way of example.

As described above, outputs from the first and second sigma-delta modulation circuits 10, 11 are formed by adding a quantized noise to input signals. The outputs are in the form of 1-bit serial logic data with a sampling rate of 122.88 KHz. Thus, the first and third 16-tap moving average digital filters 12, 13 shown in FIG. 1 serve as low-pass filters for attenuating a quantized noise in the high frequency region. As shown in FIG. 5, a digital filter is usually composed of delay means 51, 52, 53, multipliers 54, 55, 56, 57 and adders 58, 59, 60. Although the digital filter shown in FIG. 5 includes coefficients $a_0, a_1, a_2, \ldots a_{15}$ as elements for determining a type of a low-pass filter, a moving average digital filter includes a coefficients $a_0=a_1=a_2=\ldots a_{15}=1$. Therefore, the moving average digital filter can be realized by a very simple arrangement because the multipliers 54, 55, 56, 57 shown in FIG. 5 are not needed.

The first and second 16-tap moving average digital filters 12, 14 having the arrangement shown in FIG. I can be also realized as a whole by the digital filter shown in FIG. 5 (coefficient $a_n$ is not only 1). In this case, the first and second 16-tap moving average digital filters 12, 14 are expressed as follows.

$$H(z)=(1+Z^{-1}+\ldots +Z^{-15})(1+Z^{-1}+\ldots +Z^{-15})$$

The following formula can be obtained by developing the above formula.

$$H(z)=(1+2Z^{-1}+3Z^{-2}, \ldots +3Z^{-28}+2Z^{-29}+Z^{-30})$$

More specifically, the digital filter shown in FIG. 5 which has the coefficient $a_n$ of (1, 2, 3, . . . 3, 2, 1) and 31 taps is equivalent with a two-staged moving average digital filter. This is also applied to the third and fourth 16-tap moving average digital filters 13, 15 shown in FIG. 1 in the same way.

Figure 6:
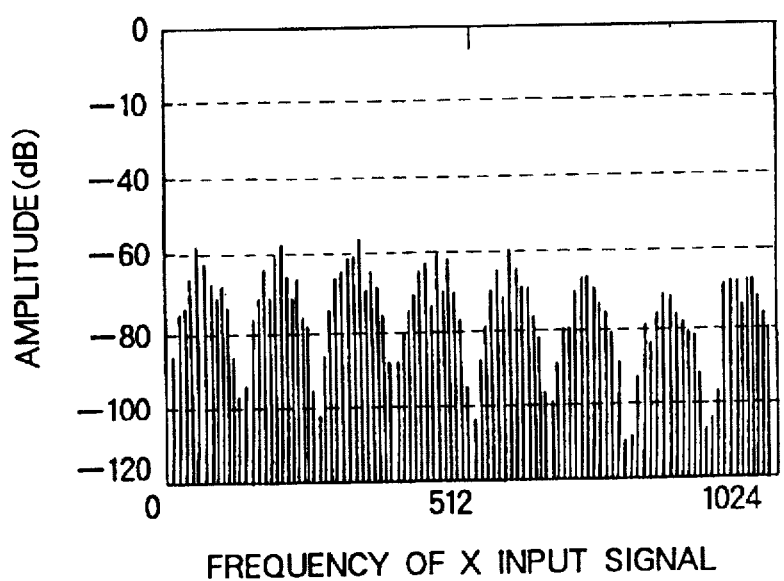
FIG. 6 is a graph showing a quantized noise spectrum having been subjected to processing by a moving average digital filter.

FIG. 6 shows a distribution of a spectrum of a quantized noise of an output having passed through the first and third 16-tap moving average digital filters 12, 13 and further the second and fourth 16-tap moving average digital filters 14, 15. Output data having a 8-bit width of the second 16-tap moving average digital filter 14 corresponding to an analog current signal i and output data having a 8-bit width of the fourth 16-tap moving average digital filter 15 corresponding to an analog voltage signal v are used by the first multiplier 18 to calculate an electric power after these outputs are subjected to a thinning-out operation for thinning out one piece of output data from respective eight pieces of output data through the 1/8 thinning-out means 141, 151.

When a precision of an electric power is examined here, voltage data V and current data I to be input to the first multiplier 18 are expressed by the following formulas (5) and (6).

$$V=V_s+\Sigma V_N \quad (5)$$

where $V_s$ is an input signal and $V_N$ is a quantized noise of each frequency.

$$I=I_s+\Sigma I_N \quad (6)$$

where $I_s$ is an input signal and $I_N$ is a quantized noise of each frequency. An electric power W and an electric power error e are expressed by the following formulas (7), (8).

$$W=V\cdot I=V_s\cdot I_s+V_s\cdot I_{NS}+V_{NS}\cdot I_s+\Sigma(V_N\cdot I_N) \quad (7)$$

where $V_{NS}$ is a quantized noise of a frequency component of a voltage signal and $I_{NS}$ is a quantized noise of a frequency component of a current signal.

$$\epsilon = \frac{W - V_s\cdot I_s}{V_s\cdot I_s} = \frac{I_{NS}}{I_S} + \frac{V_{NS}}{V_s} \frac{\Sigma(V_N\cdot I_N)}{V_s\cdot I_s} \quad (8)$$

In the case of the embodiment 1, suppose that $V_s$=0 dB and $I_s$=−42 dB (1/120 of a maximum input), $I_{NS}$=−110 dB, $V_{NS}$=−110 dB from the quantized noise level shown in FIG. 6 and further that $I_N$=−80 dB in average and $V_N$=−80 dB or less with respect to a quantized noise level of each frequency. As a result, a precision of electric power of $\epsilon \approx 0.16\%$ can be obtained from the formula (8).

Further, in the case of the embodiment 1, a moving-average value of one cycle (2048 taps) of a 1-bit logic output obtained from the first and second sigma-delta modulation circuits 10, 11 is determined by the first and second one cycle moving average digital filters 16, 17 in order to remove a direct current component produced due to the offset and the like of the first and second sigma-delta modulation circuits 10, 11. That is, direct current components $V_{DC}$ and $I_{DC}$ of a voltage and a current are extracted by determining an average value for one cycle. Output data from the first and second one cycle moving average digital filters 16, 17 is used by the second multiplier 19 which calculates a product $V_{DC}\cdot I_{DC}$ of direct current components of a current and a voltage after the output data is subjected to a thinning-out operation for thinning out one piece of output data from respective eight pieces of output data through the 1/8 thinning-out means 161, 171.

Supposing that $V=v_s+V_{DC}$ ($VD_c$ is a direct current component error), $I=I_s+I_{DC}$ ($I_{DC}$ is a direct current component error), an electric power W obtained by the first multiplier 18 is expressed by the following formula (9).

$$W=V_s\cdot I_s+V_{DC}\cdot I_{DC} \quad (9)$$

According to the embodiment 1, the subtracter 20 subtracts a product of direct current components $V_{DS}\cdot I_{DC}$ obtained by the second multiplier 19 from electric power data calculated by the first multiplier 18 according to the formula (9), so that an electric power error due to the direct current components $VD_c\cdot I_{DC}$ is removed so as to output high-precision data w and an electric energy is obtained by integrating the data w by a counter 30.

Embodiment 2

Figure 7:
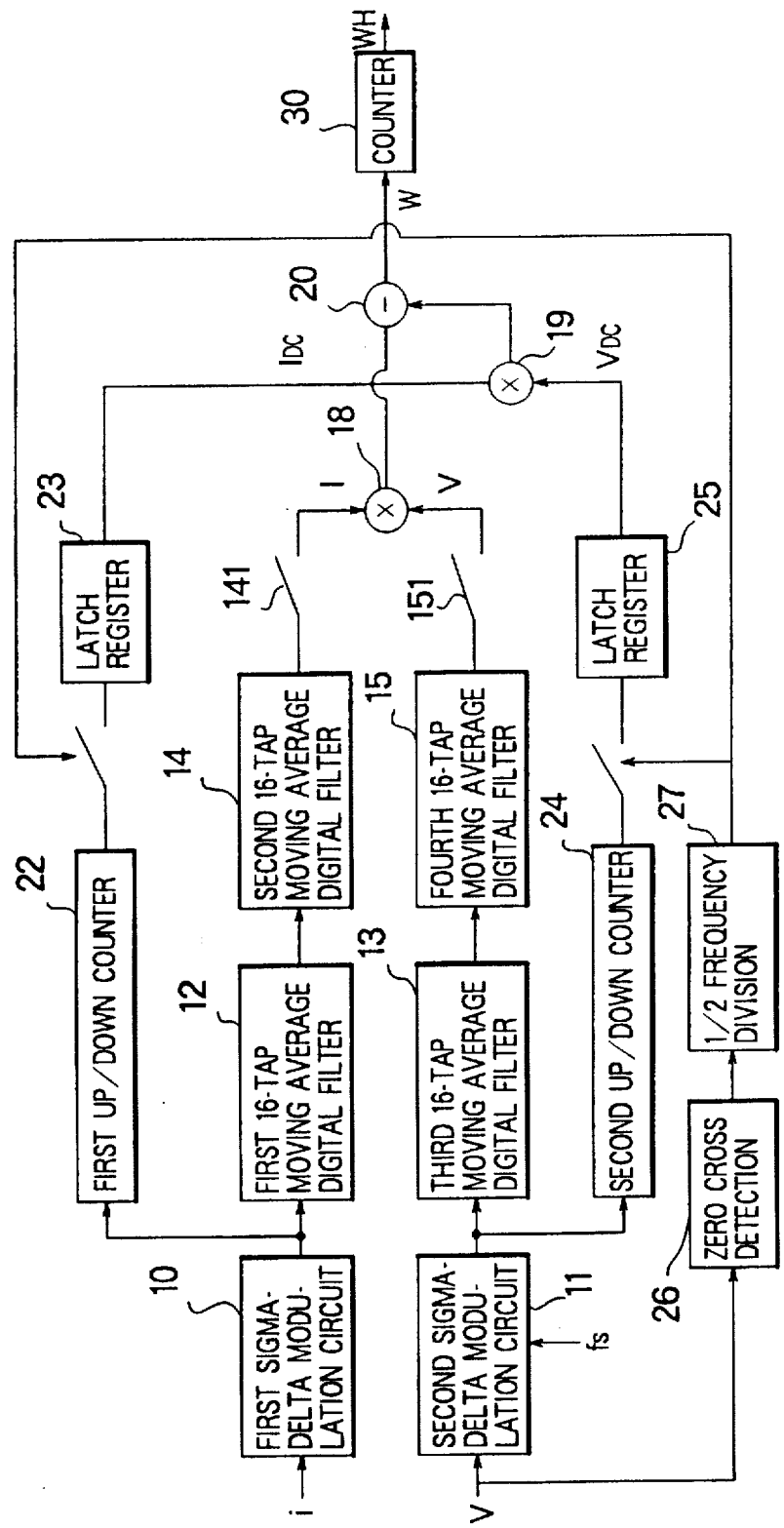
FIG. 7 shows a block diagram of an electric power calculation unit of an electronic watt-hour meter according to an embodiment 2 of the present invention.

FIG. 7 shows another embodiment of the present invention. In FIG. 7, numerals 22, 24 denote first and second up/down counters connected to the outputs of first and second sigma-delta modulation circuits 10, 11. The first and second up/down counters 22, 24 are counters which count up a 1-bit logic output supplied from the first and second sigma-delta modulation circuits 10, 11 when the logic output is a logic "1" and count down the logic output when it is a logic "0". As a result, an up-counted value and a down-counted value extract a direct current component of current and voltage signals in one cycle of an input signal.

The embodiment 2, which is advantageous in that it effectively operates even if the frequency of an input voltage signal varies, is arranged such that one cycle signal of an input voltage signal is generated by a zero-cross detector 26 and a ½ frequency-dividing circuit 27 and outputs from the first and second up/down counters 22, 24 are stored and held in latch resistors 23, 25, respectively, each time the one cycle signal is generated. Therefore, the values of the first and second latch resistors 23, 25 are values of direct current components of a current and a voltage at all times. The other arrangement of the embodiment 2 is the same as that of the embodiment 1 shown in FIG. 1, and the embodiment 2 can calculate an electric power whose error due to direct current components of a current and a voltage is reduced even if the frequency of an input voltage signal varies.

Embodiment 3

Figure 8:
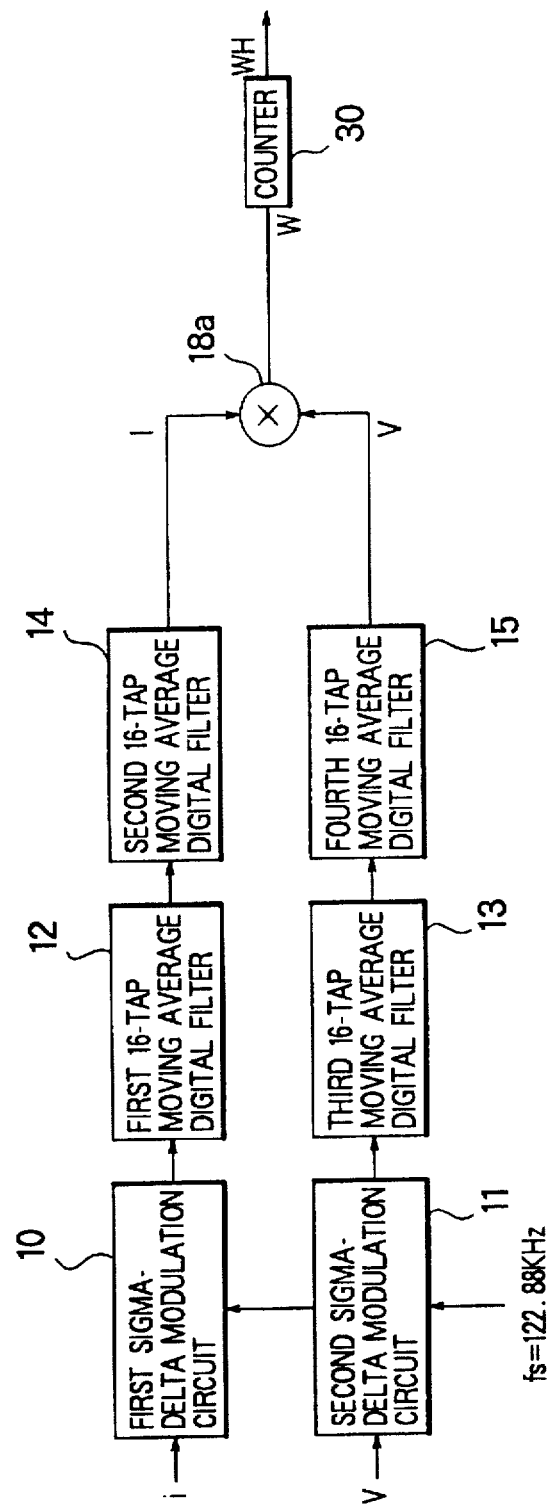
FIG. 8 shows a block diagram of an electric power calculation unit of an electronic watt-hour meter according to an embodiment 3 of the present invention.

FIG. 8 shows a further embodiment. The embodiment 3 is arranged by omitting the first and second one cycle moving average digital filters 16, 17, the ⅛ thinning-out means 141, 151, 161, 171, the second multiplier 19 and the subtracter 20 from the embodiment shown in FIG. 1, wherein data of the electric power w shown in the aforesaid formula (7) is obtained from a first multiplier 18a and cumulated by a counter 30 to thereby obtain an electric energy WH.

Embodiment 4

Figure 9:
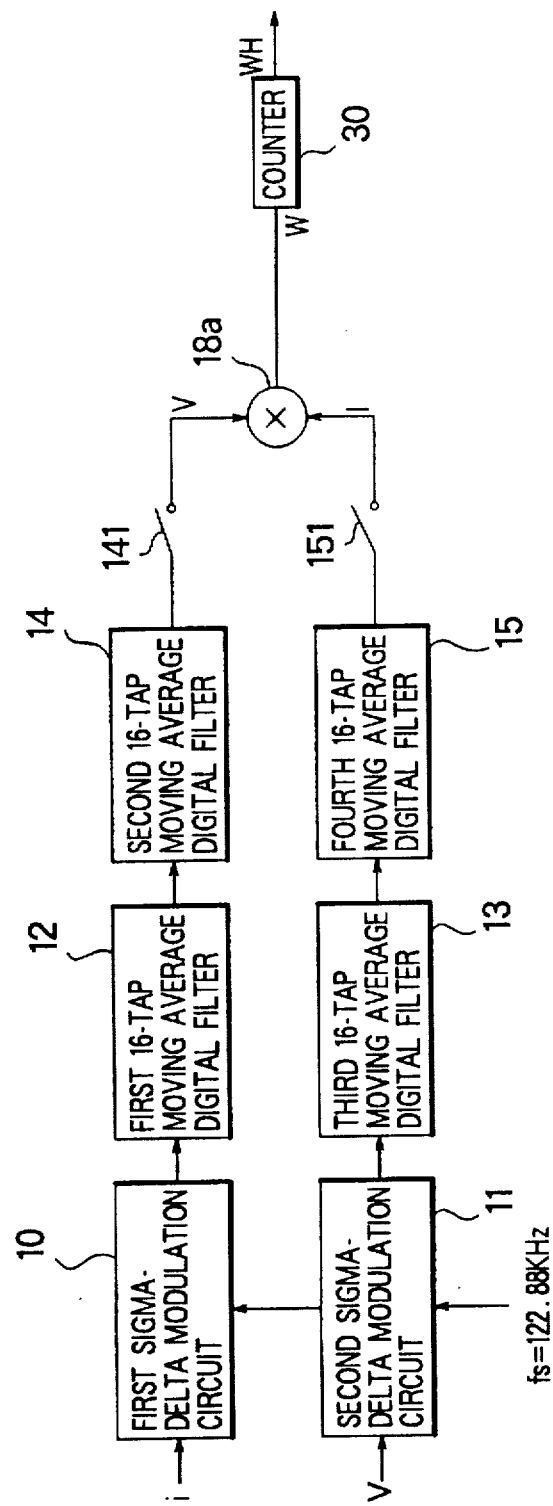
FIG. 9 shows a block diagram of an electric power calculation unit of an electronic watt-hour meter according to an embodiment 4 of the present invention.

FIG. 9 shows a still further embodiment. The embodiment 4 is arranged by providing the same ⅛ thinning-out means 141, 151 as those shown in the embodiment of FIG. 1 with the embodiment shown in FIG. 8 to reduce the number of multiplications by a thinning-out operation to thereby reduce power consumption.

Embodiment 5

Figure 10:
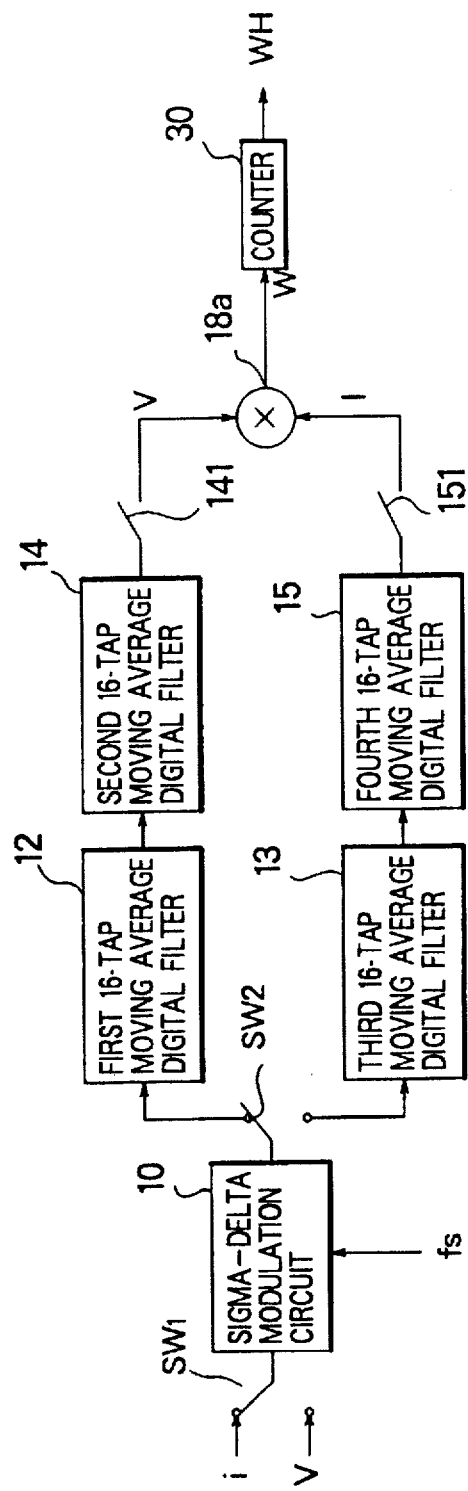
FIG. 10 shows a block diagram of an electric power calculation unit of an electronic watt-hour meter according to an embodiment 5 of the present invention.
Figure 11:
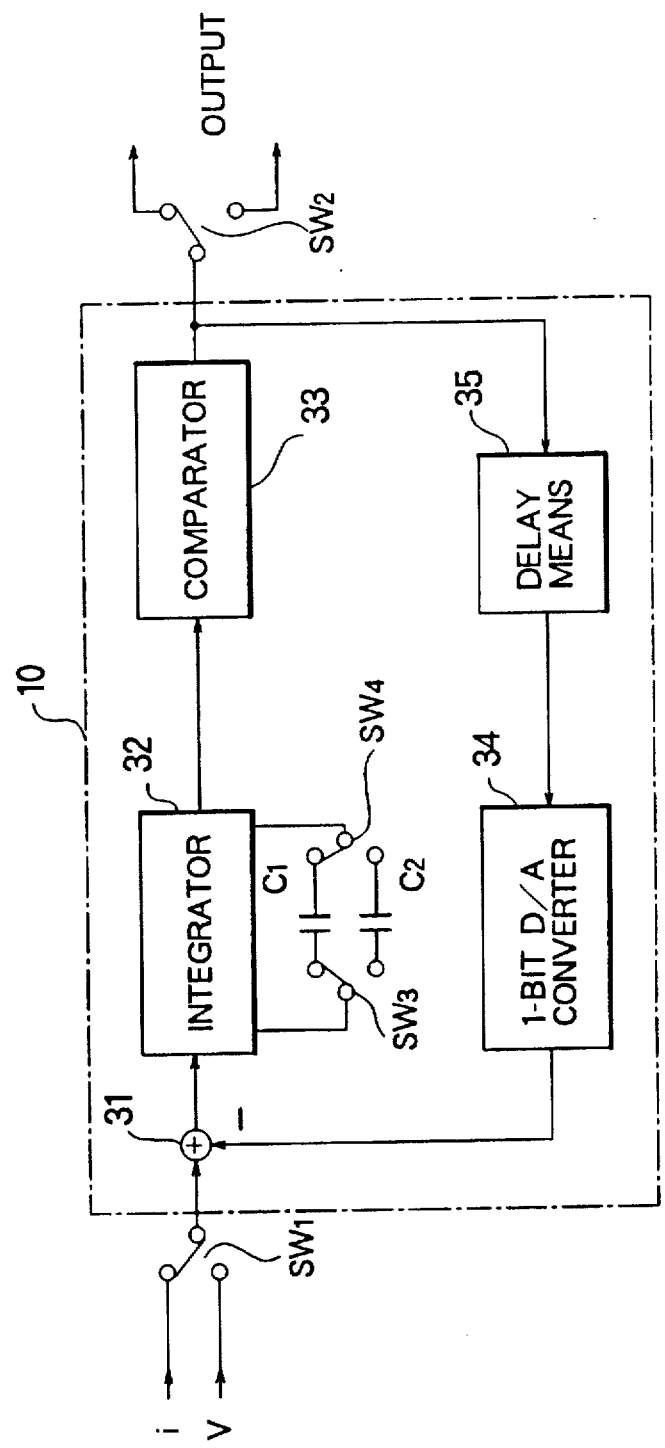
FIG. 11 shows a block diagram of a primary sigma-delta modulation circuit used for embodiments 5 and 6 of the present invention by way of example.

FIG. 10 shows a still further embodiment. The embodiment 5 includes only one sigma-delta modulation circuit and an input to the modulation circuit is multiplexed (subjected to time division). The other arrangement of this embodiment is the same as that of the embodiment shown in FIG. 9. FIG. 11 shows an internal arrangement of the sigma-delta modulation circuit 10 used in the embodiment. The sigma-delta modulation circuit 10 is a modification of the aforesaid primary sigma-delta modulation circuit shown in FIG. 2 with capacitors $C_1$, $C_2$ being selectively connected to an integrator 32 through switches SW3, SW4.

In FIGS. 10, 11, the sigma-delta modulation circuit 10 is alternately supplied with a current signal i and a voltage signal v by a switch SW1. When the current signal i is to be fetched as an input, the switches SW3, SW4 are connected to the capacitor $C_1$ to maintain a value of the current signal i in the capacitor $C_1$ as well as a switch SW2 is connected to first and second 16-tap moving average digital filters 12, 14. When the voltage signal v is to be fetched as an input, the switches SW3, SW4 are connected to the capacitor $C_2$ to maintain a value of the voltage signal v in the capacitor $C_2$ as well as the switch SW2 is connected to third and fourth 16-tap moving average digital filters 13, 15. The aforesaid switches SW1, SW2, SW3, SW4 are changed over in synchronism in response to a sampling clock $f_s$.

According to the embodiment 5, since the single sigma-delta modulation circuit 10 is used with time division multiplexing, there is an advantage that the circuit arrangement can be simplified.

When the secondary sigma-delta modulation circuit of FIG. 3 is to be used here, it suffices only to provide capacitors and switches with respective integrators 42, 47 to maintain integrated values in the same way that the integrator 32 of FIG. 11 is provided with the capacitors $C_1$, $C_2$ and the switches SW3, SW4. More specifically, in the case of a two-element input, the integrator 42 is provided with two capacitors and one switch for changing over the capacitors and the integrator 43 is provided with two capacitors and one switch for changing over the capacitors. As described above, a single sigma-delta modulation circuit can process two inputs of a current input and a voltage input by forming an integrated value maintaining means composed of a combination of capacitors and switches. In the case of multiple-element inputs in multiple-input devices such as a single-phase three-wire system, three-phase three-wire system, three-phase four-wire system and the like, it suffices only to provide a sigma-delta modulation circuit with each pair of current and voltage inputs. That is, a single sigma-delta modulation circuit can process a plurality of inputs.

Note, the integrated value maintaining means is not limited to capacitors but any means such as a register with an A/D converter or D/A converter may be used as long as it can maintain an integrated value.

Embodiment 6

Figure 12:
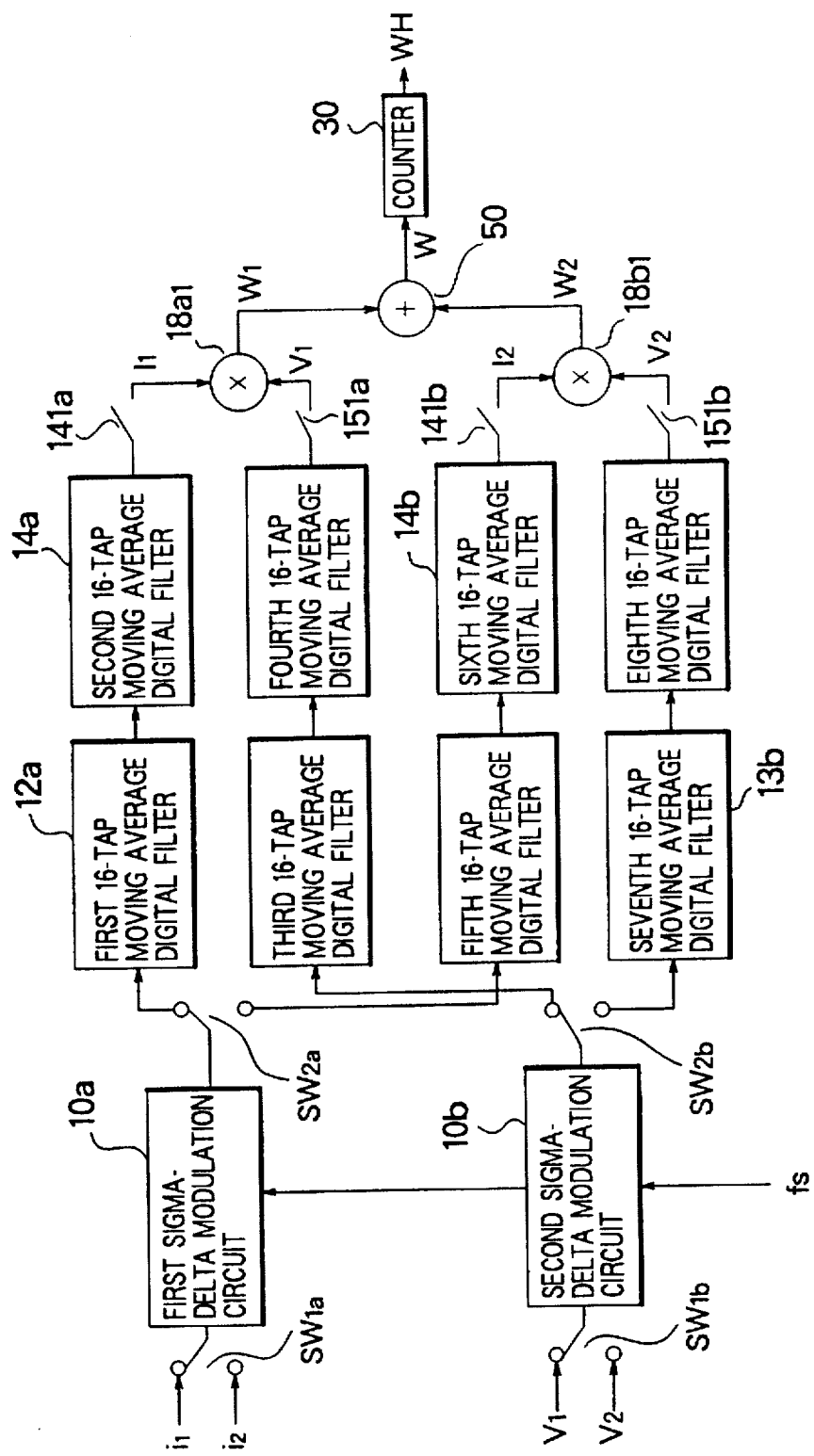
FIG. 12 shows a block diagram of an electric power calculation unit of an electronic watt-hour meter according to an embodiment 6 of the present invention.

FIG. 12 shows an embodiment of a two-element watt-hour meter for measuring an electric energy of a single-phase three-wire system or three-phase three-wire system. In FIG. 12, first and second sigma-delta modulation circuits 10a, 10b are primary sigma-delta modulation circuits having the same arrangement as those shown in FIG. 11, respectively. The first sigma-delta modulation circuit 10a alternately fetches a current signal $i_1$ from a first wire and a current signal $i_2$ from a second wire by time division multiplexing through a switch SW1a and respective values are alternately stored by the capacitors $C_1$, $C_2$ shown in FIG. 11.

When the current signal $i_1$ is to be fetched, a switch SW2a is connected to first and second 16-tap moving average digital filters 12a, 14a, and when the current signal $i_2$ is to be fetched, the switch SW2a is connected to fifth and sixth 16-tap moving average digital filters 12b, 14b. The second sigma-delta modulation circuit 10b alternately fetches a voltage signal $v_1$ from the first wire and a voltage signal $v_2$ from the third wire by time division multiplexing and respective values are alternately stored by the capacitors $C_1$, $C_2$ shown in FIG. 11.

When the voltage signal $v_1$ is to be fetched, a switch SW2b is connected to third and fourth 16-tap moving average digital filters 13a, 14a, and when the voltage signal $v_2$ is to be fetched, the switch SW2b is connected to seventh and eighth 16-tap moving average digital filters 13b, 15b. Numeral 18a1 denotes a multiplier for calculating an electric power $W_1$ by multiplying current data $I_1$ by voltage data $V_1$ each based on the current signal $i_1$ and the voltage signal $v_1$, numeral 18b1 denotes a multiplier for calculating an electric power $W_2$ by multiplying current data $I_2$ by voltage data $V_2$ each based on the current signal $i_2$ and the voltage signal $v_2$, and numeral 50 denotes an adder for obtaining electric power data w by adding outputs from the multipliers 18a1, 18b1. Needless to say, when the first sigma-delta modulation circuit 10a fetches the current data $i_1$, the second sigma-delta modulation circuit 10b fetches the voltage data $v_1$, and in the same way when the former fetches the current data $i_2$, the latter fetches the voltage data $v_2$.

According to this embodiment, electric power data w of the single-phase three-wire system or three-phase three-wire system can be obtained in such a manner that outputs W1 and W2 from the multipliers 18a1 and 18b1 are added by the adder 50 and an electric energy WH thereof can be obtained by integrating the added values by a counter 30.

Embodiment 7

Figure 13:
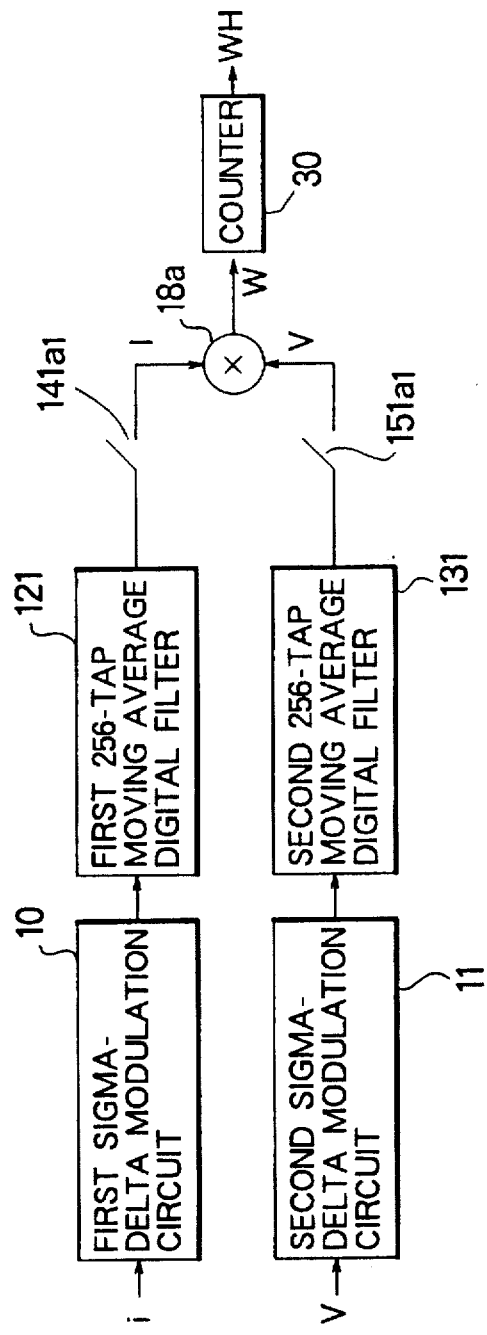
FIG. 13 shows a block diagram of an electric power calculation unit of an electronic watt-hour meter according to an embodiment 7 of the present invention.

FIG. 13 shows a still further embodiment. The embodiment 7 includes only a single stage of a moving average filter connected to first and second sigma-delta modulation circuits 10, 11, respectively and the moving average filter is composed of first and second 256-tap moving average digital filters 121, 131 each having the number of moving average taps of 256. The first and second 256-tap moving average digital filters 121, 131 has an 8-bit output. One output, which is thinned out by 1/32 thinning-out means 141a, 151a from respective 32 outputs from the first and second moving average digital filters 121, 131, is supplied to a multiplier 18a to obtain a signal w corresponding to an electric power and to obtain an electric energy WH which is determined by integrating the signal w by a counter 30.

According to the aforesaid embodiments 1–7, a multiplication can be carried out by using data having a smaller bit width by the A/D conversion executed by the combination of a sigma-delta modulation circuit and a moving average digital filter as compared with the case in which a multiplication is carried out by a conventional multi-bit sequentially comparing type A/D conversion. As a result, a high-precision electric power can be calculated by a multiplier composed of a small circuit.

An analog unit includes only the sigma-delta modulation circuit and other circuits are composed of digital circuits each of which is mainly composed of a digital circuit with a small analog scale. Therefore, this arrangement is suitable for a monolithic IC and expected to be very advantageous when a device having such an arrangement is produced on a large scale.

Since the moving average digital filter is used as a low-pass filter, a multiplier is not needed in the digital filter, by which the low-pass filter can be realized by a simple arrangement.

Embodiment 8

The embodiment 8 provide an electronic watt-hour meter which is a little different from the arrangement of the embodiment 1.

Figure 14:
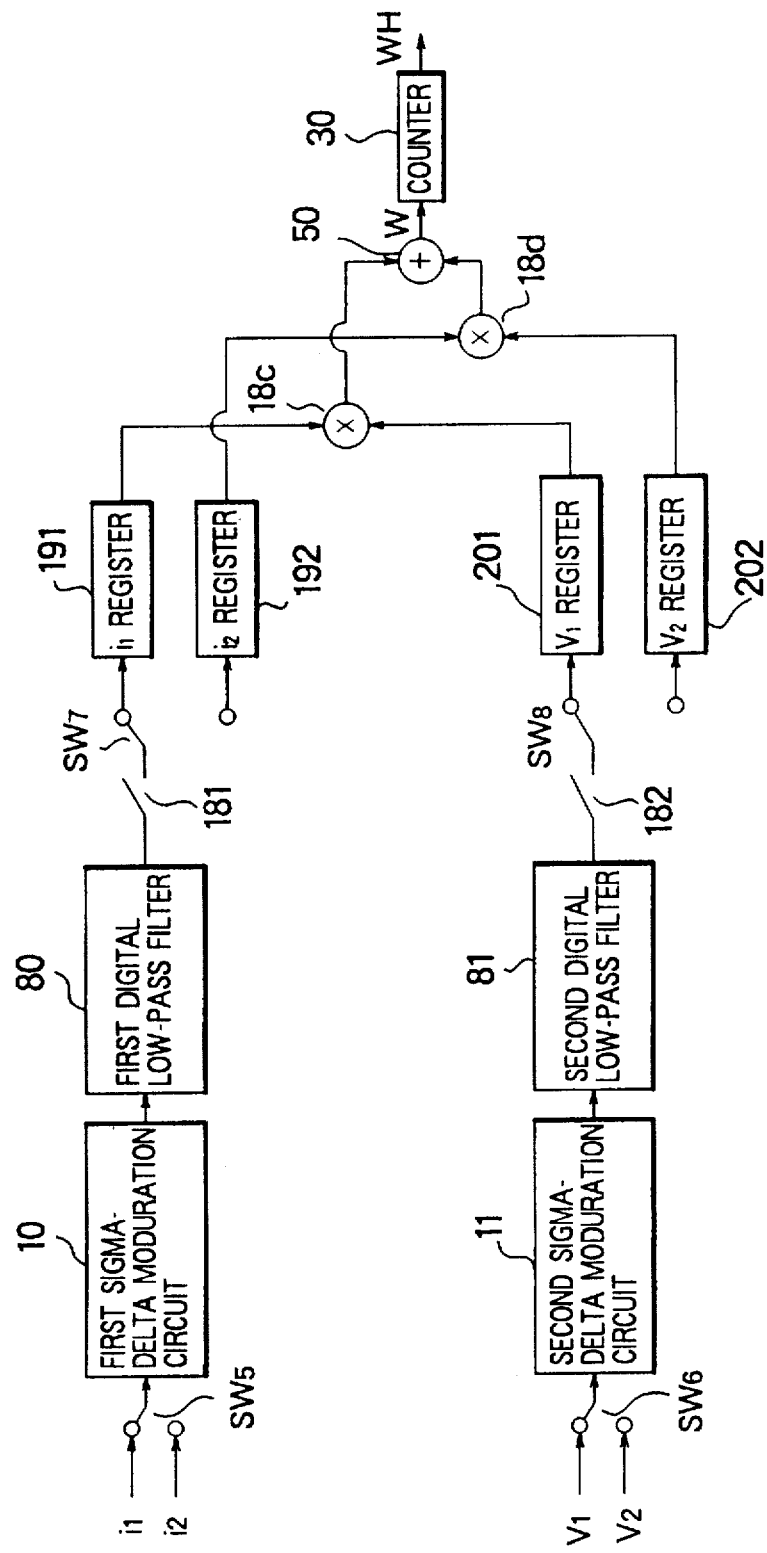
FIG. 14 shows a block diagram of an electric power calculation unit of an electronic watt-hour meter according to an embodiment 8 of the present invention.
Figure 15:
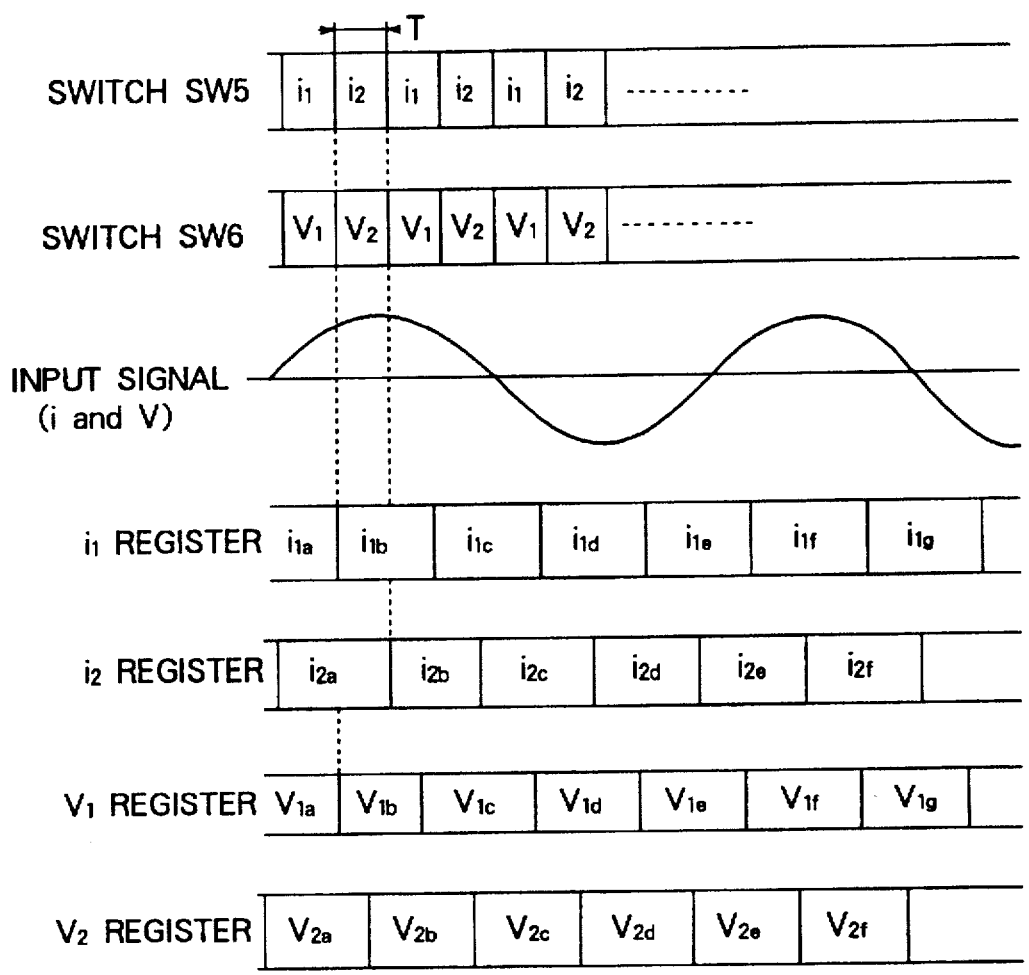
FIG. 15 shows a diagram explaining operation of FIG. 14.
Figure 16:
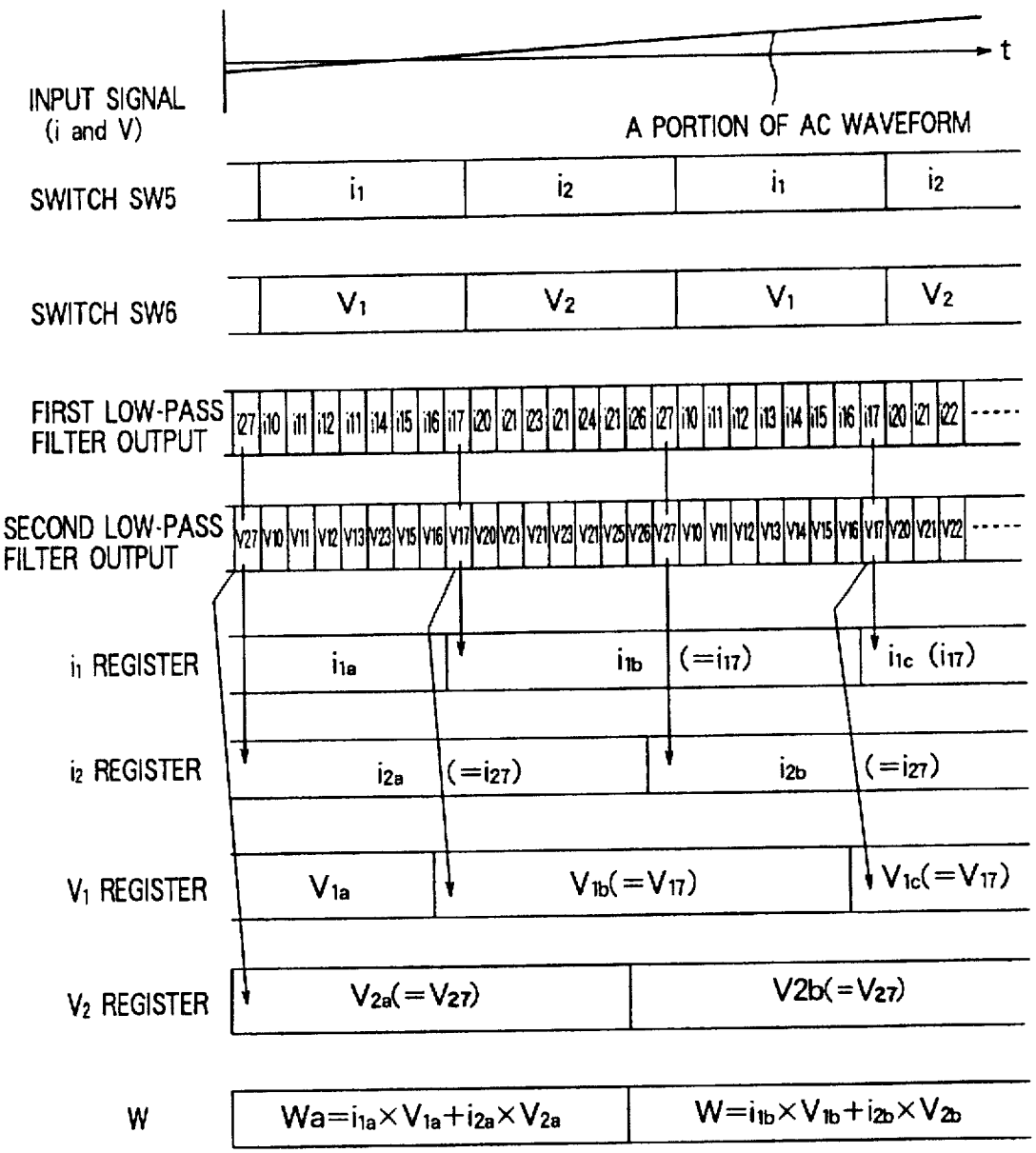
FIG. 16 shows a diagram explaining operation of FIG. 14.

FIG. 14 shows the embodiment 8 for measuring an electric energy of two elements such as a single-phase three-wire system or a three-phase three-wire system. FIG. 15 is a diagram explaining operation of the embodiment and FIG. 16 is a diagram explaining operation with an expanded time axis.

In FIG. 14, first and second sigma-delta modulation circuits 10, 11 are the same as that shown in FIG. 2 or FIG. 3. A first digital low-pass filter 80 and a second digital low-pass filter 81 are the same as that shown in FIG. 5 and have n sets of delay means. Thinning-out means 181, 182 carry out a thinning-out operation at a ratio of 1/m. Note, m is a value equal to or larger than n.

A switch SW5 fetches an input $i_1$ and at the time a switch SW6 fetches an input $v_1$. On the other hand, a switch SW7 is connected to an $i_1$ register 191 and a switch SW8 is connected to a $v_1$ register 201. The first digital low-pass filter 80 outputs a train of sampled values of an AC current through the first sigma-delta modulation circuit 10. After the switches SW5 and SW6 are selected, the thinning-out means 181 supplies a m-th train of sampled value to the $i_1$ register 191. The second digital low-pass filter 81 outputs a train of sampled values of an AC voltage through the second sigma-delta modulation circuit 11. After the switches SW6 and SW8 are selected, the thinning-out means 182 supplies a m-th train of sampled value to the $v_1$ register 201.

As shown in FIG. 15, this operation is such that $i_{10}$ and $v_{10}$ are fetched to the $i_1$ register 191 and the $v_1$ register 201, respectively with respect to the inputs $i_1$, $v_1$. FIG. 16 shows the detail of the operation, wherein m is set to a value 8 and an eighth value $i_{17}$ of a train of sampled values $i_{10}$–$i_{17}$ is thinned out with respect to the input $i_1$ and stored in the $i_1$ register 191 as $i_{1b}$ and an eighth value $v_{17}$ of a train of sampled values $v_{10}$–$v_{17}$ is thinned out with respect to the input $v_1$ and stored in the $v_1$ register 201 as $v_{1b}$. In the same way, $i_{1a}$, $i_{1b}$, $i_{1c}$, . . . , $v_{1a}$, $v_{1b}$, $v_{1c}$, . . . are successively fetched.

The thus obtained quantized data ($i_{1a}$, $i_{1b}$, $v_{1a}$, $v_{1b}$) of $i_1$, $i_2$, $v_0$, $v_1$, $v_2$ is subjected to a calculation of $w=(i_1 \times v_1)+(i_2 \times v_2)$ by multipliers 18c, 18d and an adder 50 and resulting values are cumulated by a counter 30 to obtain an electric energy. Thereafter, the same operation is repeated.

Since the digital low-pass filters shown in FIG. 5 are used as the first and second digital low-pass filters 10, 11, even if an output has 8 bits or less, a sufficient precision can be maintained as described in the embodiment 1.

The embodiment 8 is advantageous in that when it is applied to multi-element inputs such as a single-phase three-wire system, three-phase three-wire system, three-phase four-wire system and the like which need a plurality of AC currents and AC voltages, the sigma-delta modulation circuit and the digital low-pass filter can be used together, so that the circuit scale can be reduced to realize a low cost arrangement.

Further, in the case of a single-phase two-wire system in place of the multi-element input, the embodiment 8 can be applied to a circuit which does not need changeover of a switch.

Embodiment 9

Figure 17:
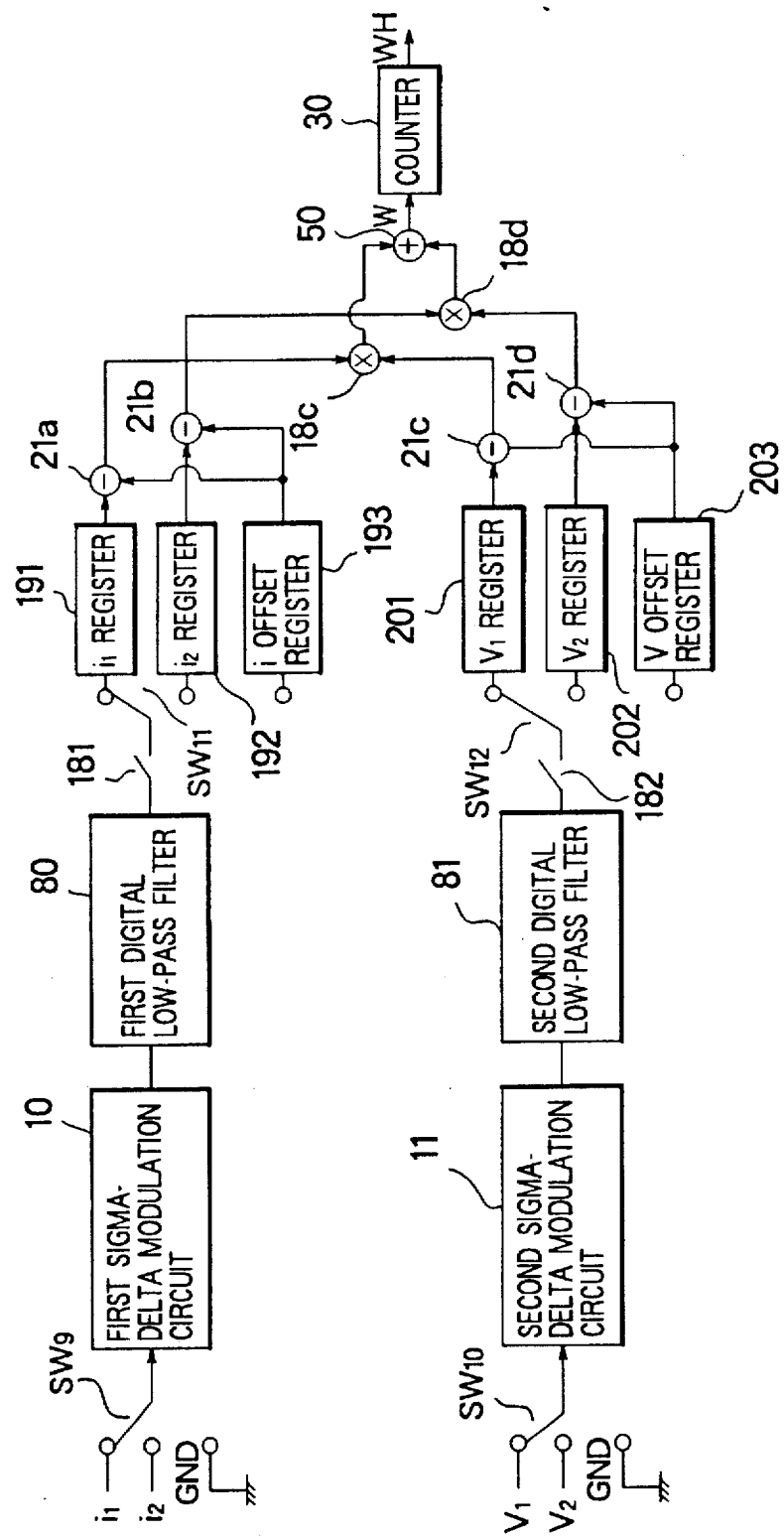
FIG. 17 shows a block diagram of an electric power calculation unit of an electronic watt-hour meter according to an embodiment 9 of the present invention.
Figure 18:
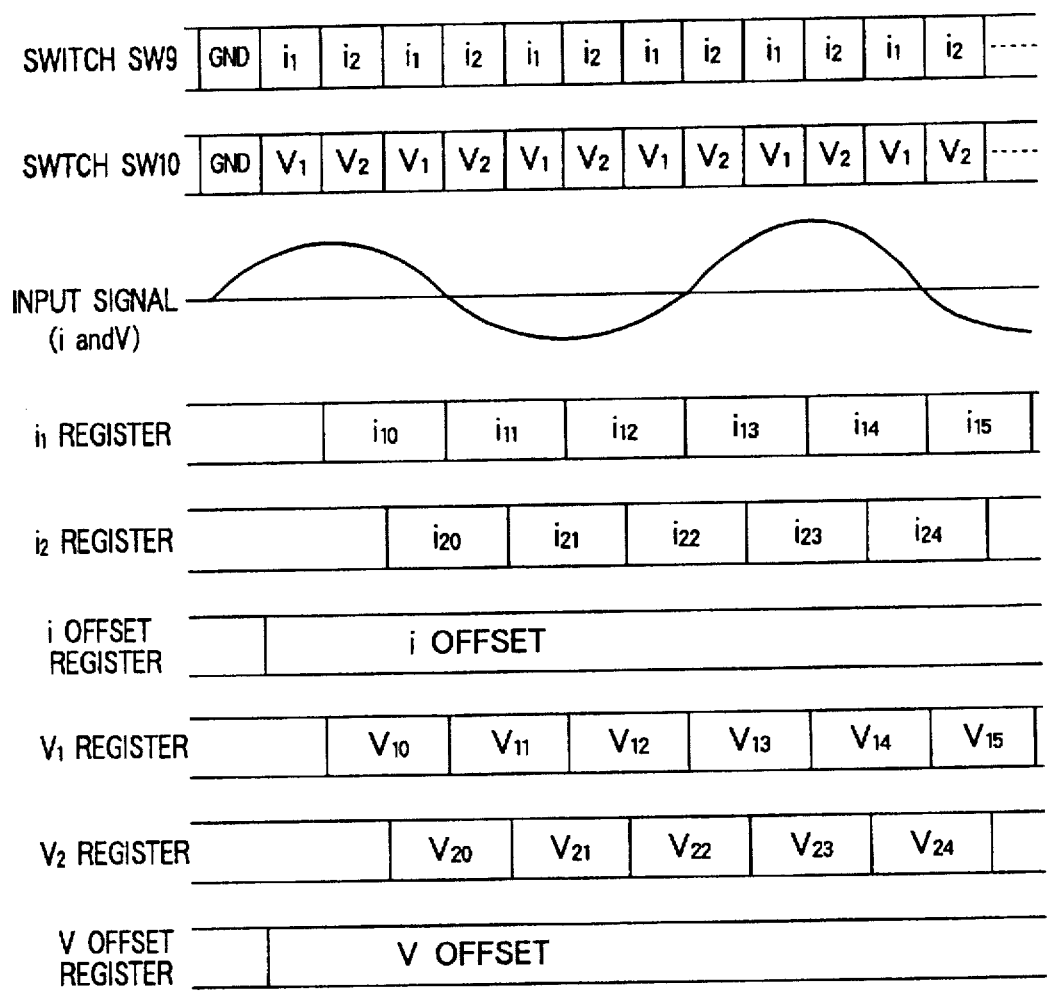
FIG. 18 shows a diagram explaining operation of FIG. 17 and FIG. 19.

The embodiment 9 provides an electronic watt-hour meter including offset adjustment means capable of adjusting an offset. FIGS. 17 and 18 show the embodiment 9.

The embodiment 9 includes an i offset register 193, a v offset register 203, subtracters 21a, 21b, 21c, 21d in addition to first and second sigma-delta modulation circuits 10, 11, first and second digital low-pass filters 80, 81 and thinning-out means 181, 182 which are arranged in the same way as those of the embodiment 8.

According to this embodiment, first, a GND signal as a reference potential is fetched by selecting input switches SW9 and SW10 and data is fetched to and stored in the i offset register 193 and the v offset register 203, respectively. Thereafter, currents $i_1$ and $i_2$ are alternately fetched on a current side and voltages $v_1$ and $v_2$ are alternately fetched on a voltage side as shown in a diagram of FIG. 18 explaining the operation of embodiment 9. At the time, data is fetched to an $i_1$ register 191, an $i_2$ register 192, a $v_1$ register 201, and a $v_2$ register 202 in the same way as the embodiment 8.

Quantized data fetched to the respective registers are subjected to a calculation of $w=(i_1-i\ \text{offset})\times(v_1-v\ \text{offset})+(i_2-i\ \text{offset})\times(v_2-v\ \text{offset})$ by subtracters 21a, 21b, 21c, 21d, multipliers 18c, 18d and adder 50 and resulting values are cumulated by a counter 30 to obtain an electric energy. More specifically, correction is carried out by subtracting an offset electric power from an electric power prior to an offset adjustment.

The embodiment 9 is advantageous in that a DC offset which exists in an analog circuit and causes an error of a measured electric energy can be adjusted and a high-precision electronic watt-hour meter can be realized by a small circuit arrangement without increasing the number of sigma-delta modulation circuits and digital low-pass filters.

Embodiment 10

Figure 19:
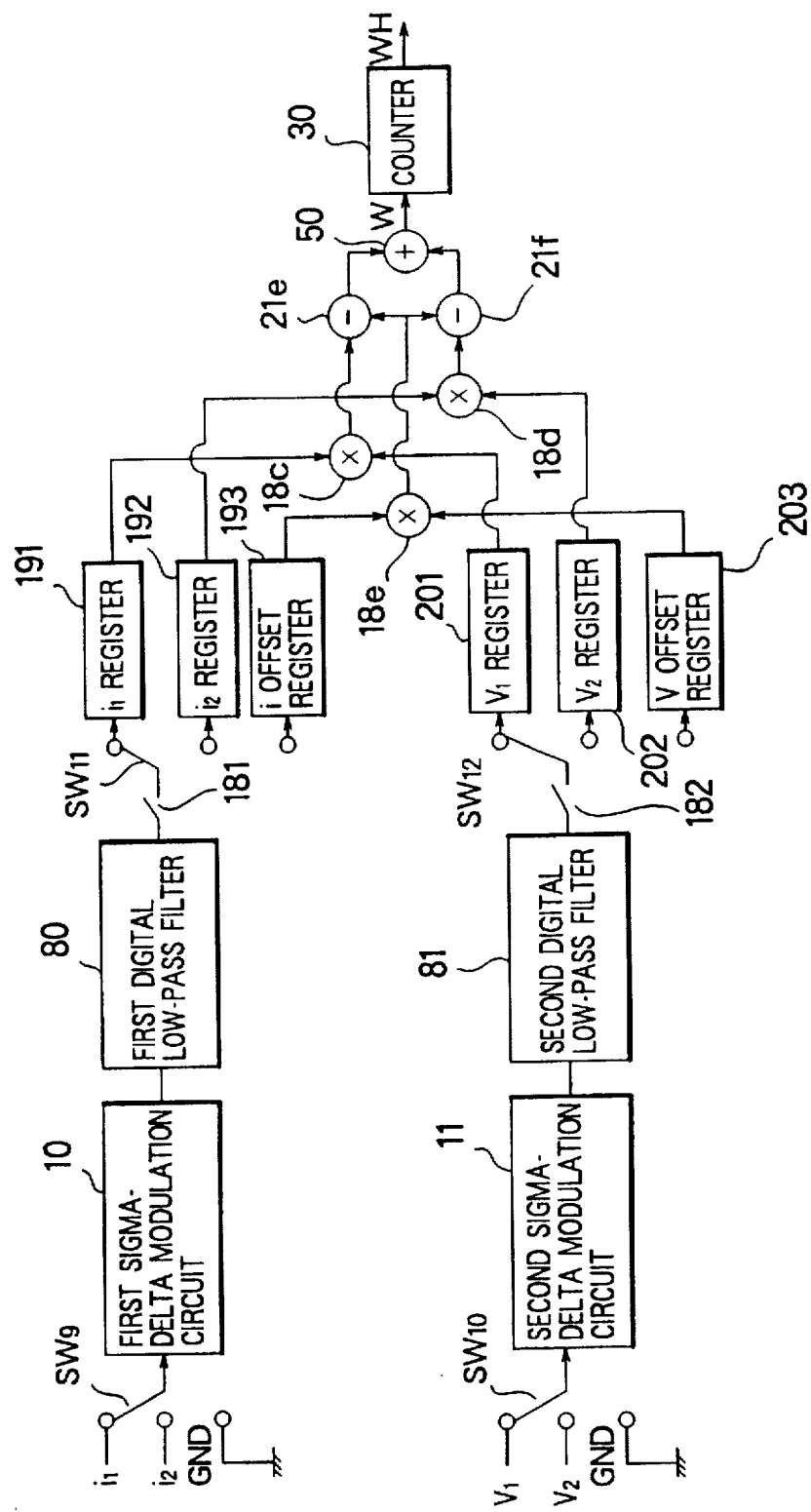
FIG. 19 shows a block diagram of an electric power calculation unit of an electronic watt-hour meter according to an embodiment 10 of the present invention.

The embodiment 10 shown in FIG. 19 is a modification of the embodiment 9.

The arrangement and operation of the embodiment 10 up to an $i_1$ register 191, an $i_2$ register 192, an i offset register 193, a $v_1$ register 201, a $v_2$ register 202, and a v offset register 203 are the same as those of the embodiment 9.

Thereafter, $w=(i_1 \times v_1)-(i \text{ offset} \times v \text{ offset})+(i_2 \times v_2)-(i \text{ offset} \times v \text{ offset})$ is calculated by a different calculation circuit and resulting values are cumulated by a counter 30 to obtain an electric energy. An obtained result is the same as that of the embodiment 9 and correction is carried out by subtracting an offset electric power from an electric power prior to an offset adjustment.

Consequently, an advantage similar to that of the embodiment 9 can be obtained.

Embodiment 11

Figure 20:
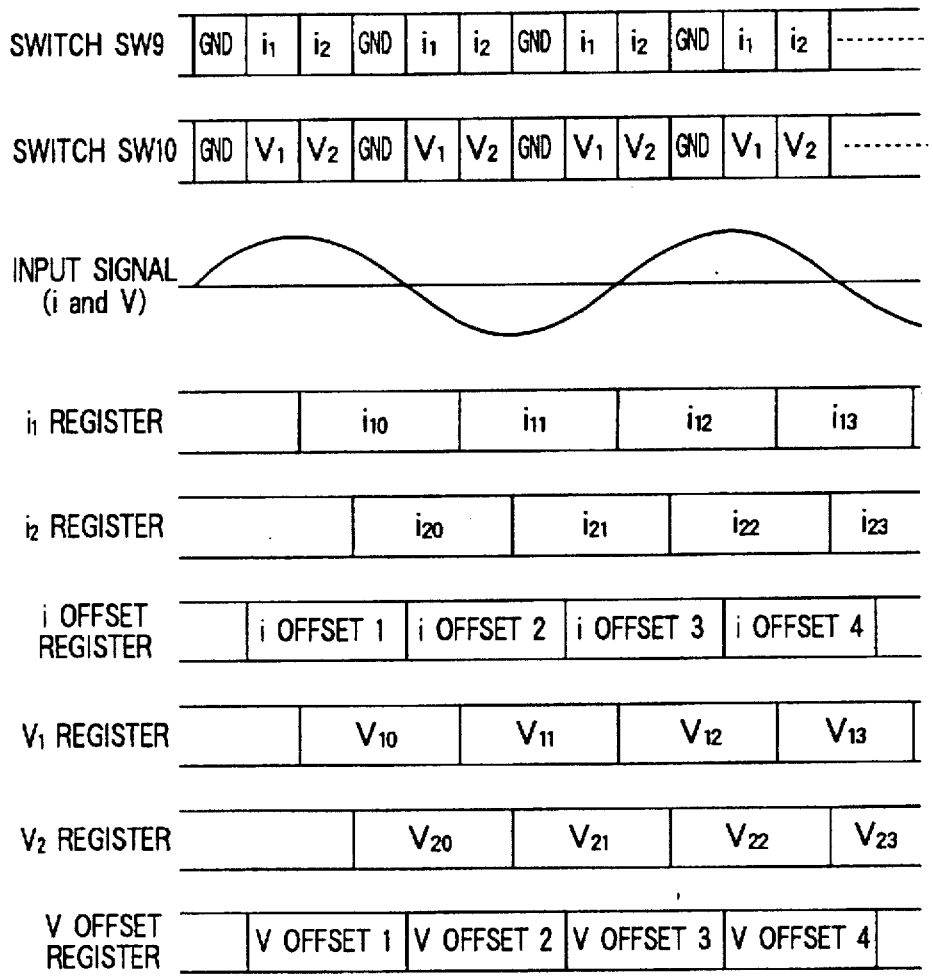
FIG. 20 shows a diagram explaining operation of an embodiment 11 of the present invention.

The embodiment 11 is a modification of the embodiments 9 and 10. In the arrangements of FIGS. 17 and 19, the switch SW9 successively and repeatedly fetches GND, $i_1$, and $i_2$ and the switch SW10 successively and repeatedly fetches GND, $v_1$, and $v_2$. In correspondence with this operation, the switches SW11, SW12 are also successively changed over including the i offset register 193 and the v offset register 203. FIG. 20 is a diagram explaining operation of the embodiment, wherein offset current and offset voltages at respective times are successively measured and used for adjustment.

This embodiment is advantageous in that since an i offset and a v offset are fetched at all times, the embodiment is difficult to be affected by the variation due to a temperature, aged deterioration and the like of a DC offset existing in an analog circuit, so that a high-precision electronic watt-hour meter can be realized.

Embodiment 12

Figure 21:
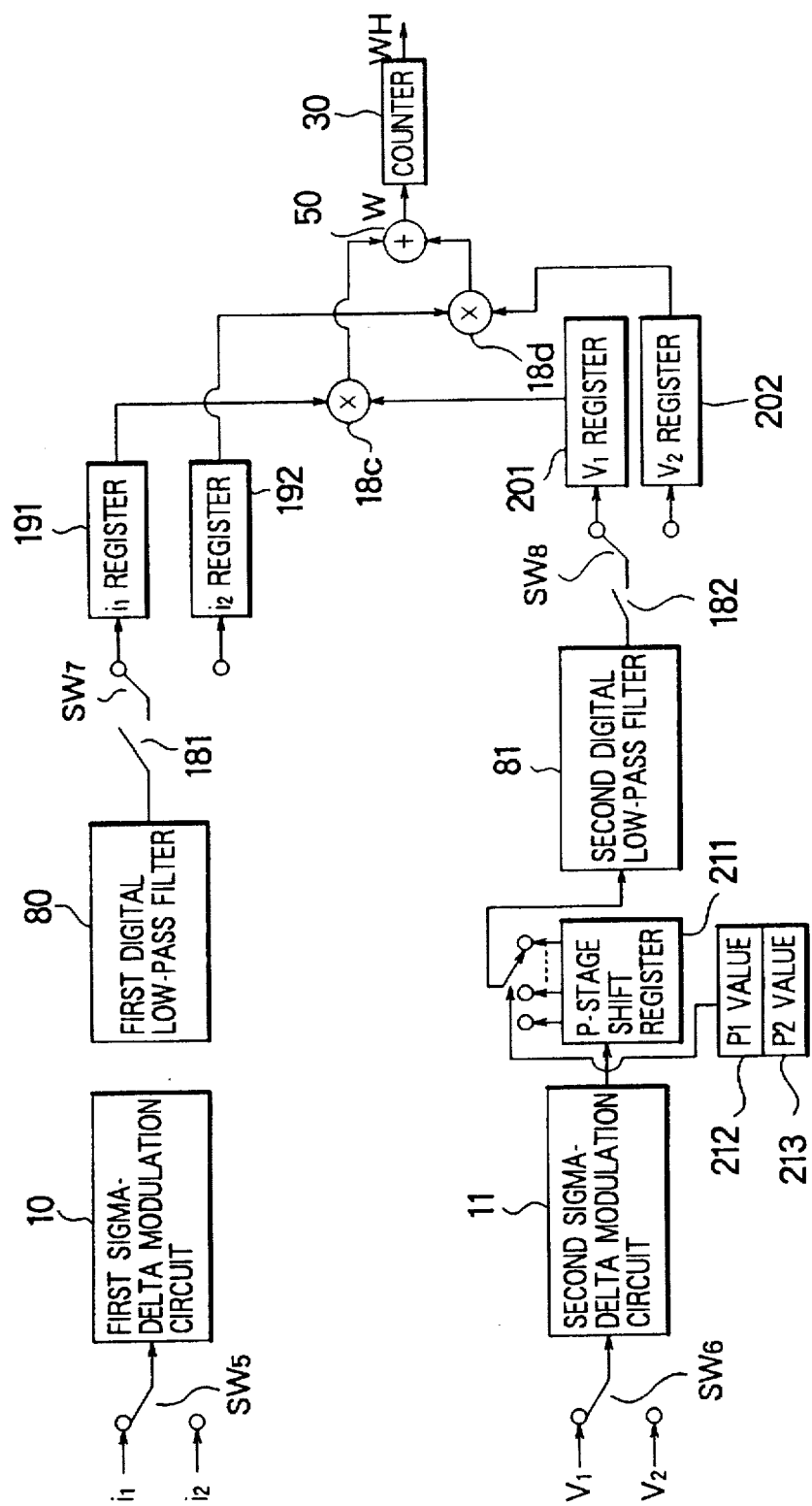
FIG. 21 shows a block diagram of an electric power calculation unit of an electronic watt-hour meter according to an embodiment 12 of the present invention.

The embodiment 12 shown in a block diagram of FIG. 21 provides an electronic watt-hour meter having delay means capable of adjusting a voltage phase angle.

The embodiment 12 is arranged such that a P-stage shift register 211 is disposed between the second sigma-delta modulation circuit 11 and the second digital low-pass filter 81 in the arrangement of the embodiment 8. A P1 register 212 and a P2 register 213 are provided to determine the number of shifts of the P-stage. The thinning-out means 181 and 182 carry out a thinning-out operation at a ratio of 1/(m+P). Note, m is a value equal to or larger than n (n: the number of stages the digital low-pass filter of FIG. 5).

When an AC voltage signal $v_1$ is fetched, the P-stage shift register 211 is connected to the second digital low-pass filter 81 in response to an output of the shift stage number according to a P1 value stored in the P1 register 212. Consequently, a phase of the AC voltage signal $v_1$ is delayed by a period of time corresponding to the number of stages of the P-stage shaft register 211 as compared with that of an AC current signal $i_1$. In the same way, when an AC voltage signal $v_2$ is fetched, the P-stage shift register 211 is connected to the second digital low-pass filter 81 in response to an output of the shift stage number according to a P2 value stored in the P2 register 213. Consequently, a phase of the AC voltage signal $v_2$ is delayed by a period of time corresponding to the number of stages of the P-stage shaft register 211 as compared with that of an AC current signal $i_2$.

This embodiment has an advantage as described below. In general, an AC current signal is detected by a CT and an AC voltage signal is detected by a VT and a phase angle error is caused between a primary side and a secondary side by the detecting elements of the CT and VT at the time. According to the embodiment 12, however, the phase angle error of the CT and VT can be removed by the P-stage shift register 211, the P1 register 212 and the P2 register 213, so that a high-precision electronic watt-hour meter with a small circuit scale can be provided.

Embodiment 13

Figure 22:
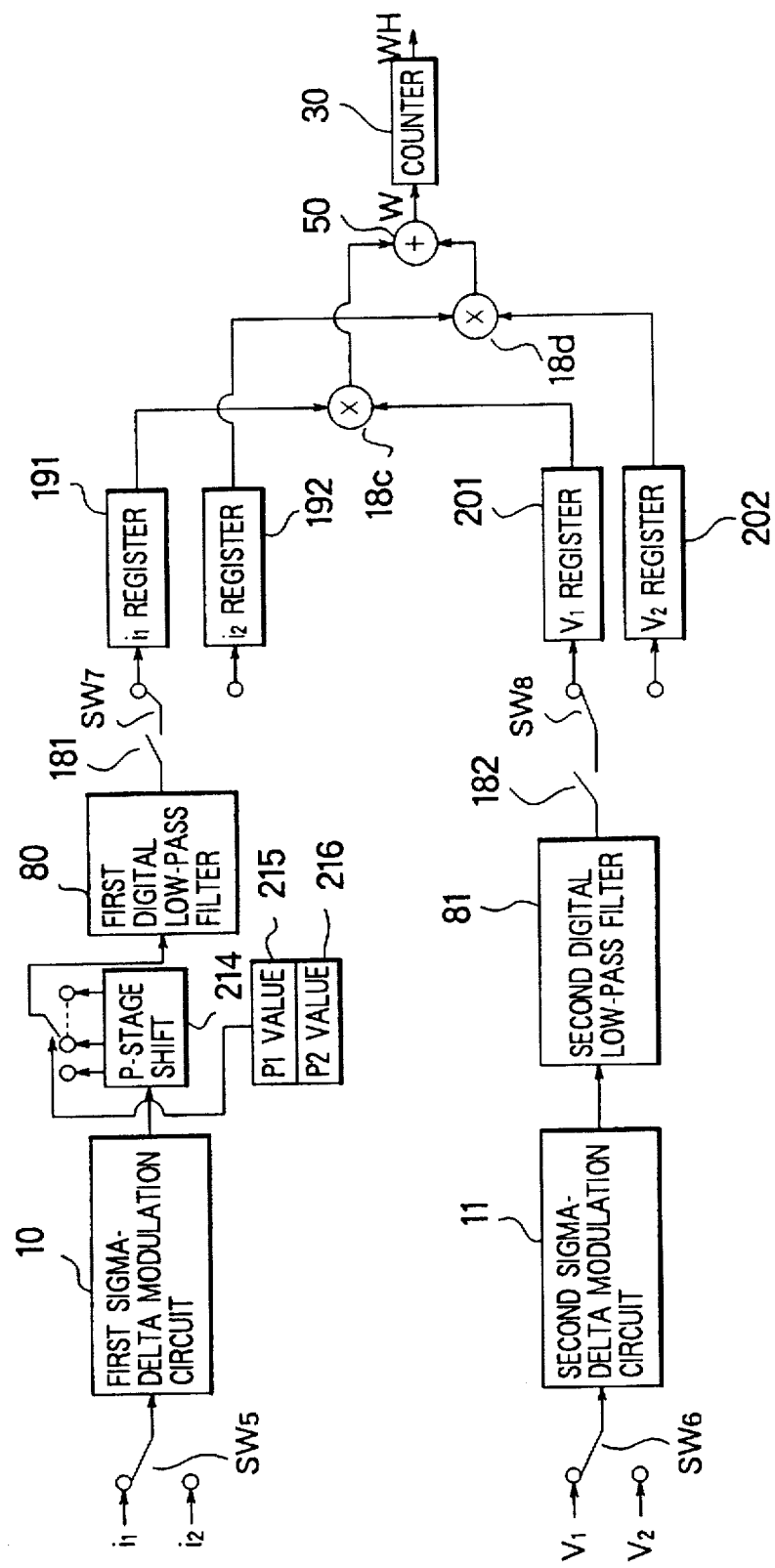
FIG. 22 shows a block diagram of an electric power calculation unit of an electronic watt-hour meter according to an embodiment 13 of the present invention.

The embodiment 13 shown in a block diagram of FIG. 22 provides an electronic watt-hour meter having delay means capable of adjusting a current phase angle.

This embodiment is arranged such that a P-stage shift register 214, a P1 register 215 and a P2 resister 216 are provided on a current side in the embodiment 8.

Consequently, phases of AC current signals $i_1$ and $i_2$ can be delayed by a period of time corresponding to the number of stages of the P-stage shift resister as compared with those of AC voltage signals $v_1$ and $v_2$.

Further, phase angles of a voltage and a current can be optionally adjusted by combining the embodiment 13 with the embodiment 12.

Embodiment 14

The embodiment 14 provides an electronic watt-hour meter including balance adjustment means capable of carrying out a balance adjustment for measuring multi-element inputs in such cases as a single-phase three-wire system, three-phase three-wire system, three-phase four-wire system and the like.

Figure 23:
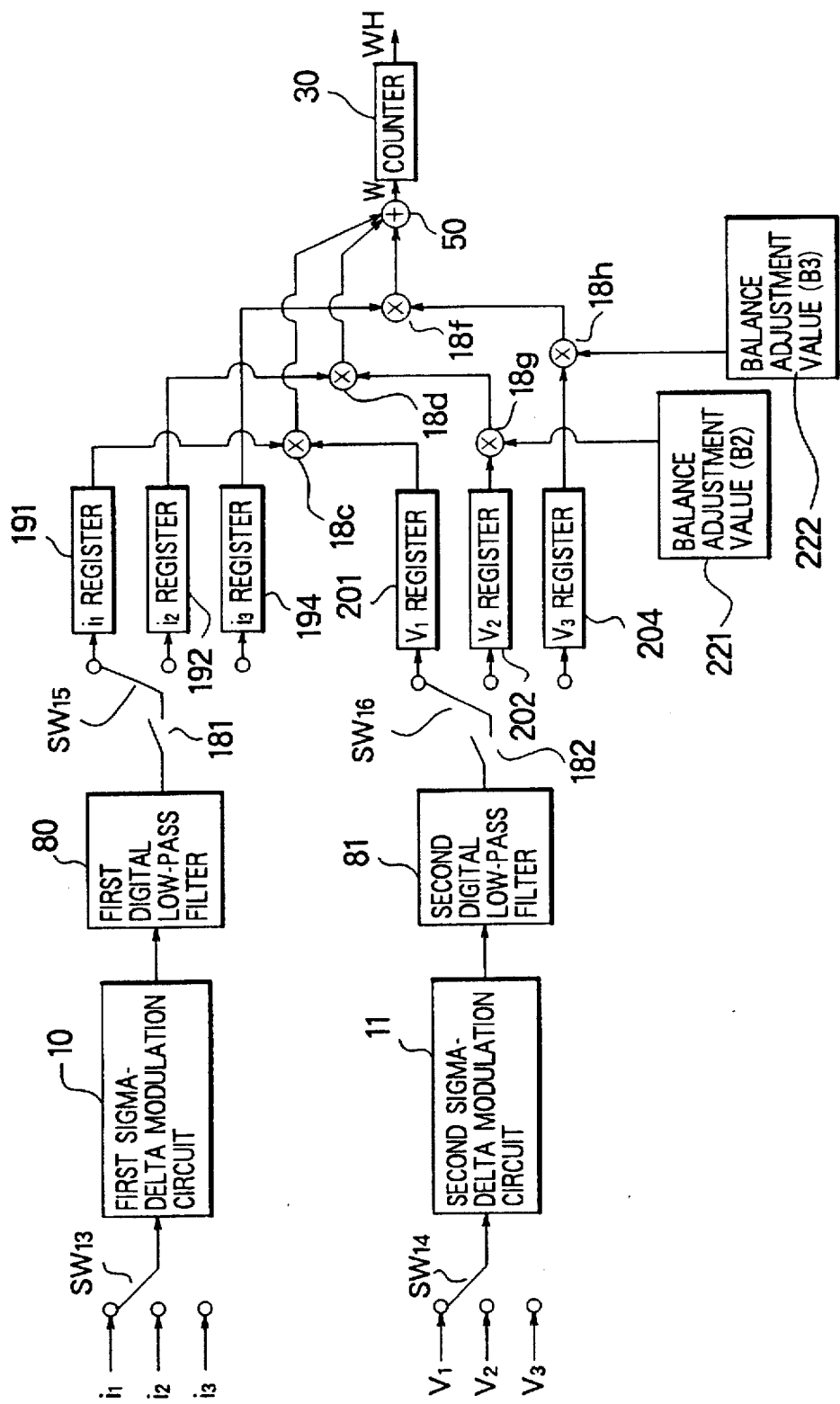
FIG. 23 shows a block diagram of an electric power calculation unit of an electronic watt-hour meter according to an embodiment 14 of the present invention.

FIG. 23 shows a block diagram of a 3-element watt-hour meter for measuring an electric energy of the three-phase four-wire system.

In FIG. 23, the arrangement of the embodiment 14 up to an $i_1$ register 191, an $i_2$ register 192, an $i_3$ register 194, a $v_1$ register 201, a $v_2$ register 202, and a $v_3$ register 204 is the same as that of the embodiment 8 except that it is applied to the three-phase four-wire system.

The embodiment 14 is provided with balance adjustment registers 221 and 222. Switches SW13 and SW14 are connected to inputs $i_1$ and $v_1$ prior to the operation of the watt-hour meter to input a reference current and a reference voltage, and $w_1 = i_1 \times v_1$ is calculated and stored based on the values of the $i_1$ register 191 and the $v_1$ register 201 obtained at the time.

Next, the switches SW13 and SW14 are connected to inputs $i_2$ and $v_2$ to input a reference current and a reference voltage, $w_2 = i_2 \times v_2$ is calculated based on the values of the $i_2$ register 192 and the $v_2$ register 202 obtained at the time, and a value $B2 = w_1/w_2$ is set to the balance adjustment register 221.

Next, the switches SW13 and SW14 are connected to inputs $i_3$ and $v_3$ to input a reference current and a reference voltage, $w_3 = i_3 \times v_3$ is calculated based on the values of the $i_3$ register 194 and the $v_3$ register 204 obtained at the time, and a value $B3 = w_1/w_3$ is set to the balance adjustment register 222.

Preparation is completed by the above procedure and thereafter the switches SW13 and SW14 are successively switched in the same way as the embodiment 8 to calculate $w=(i_1 \times v_1)+(i_2 \times v_2 \times B2)+(i_3 \times v_3 \times B3)$ and resulting values are cumulated by a counter 30 to obtain an electric energy.

In the case of a single-phase three-wire system and a three-phase three-wire system, the embodiment 14 becomes a 2-element watt-hour meter because it is only necessary to check the balance of $i_1$, $i_3$, $v_1$, $v_3$ and in this case the adjustment register 222 is removed.

The embodiment 14 has the following advantage. When a measurement is made for multi-elements, each element has an error causing factor such as VT, CT and the like. Since the embodiment 14 has the balance adjustment registers 221 and 222 to match measuring precisions between respective elements, however, the embodiment can provide a high-precision watt-hour meter by adjusting values in the registers.

Embodiment 15

Figure 24:
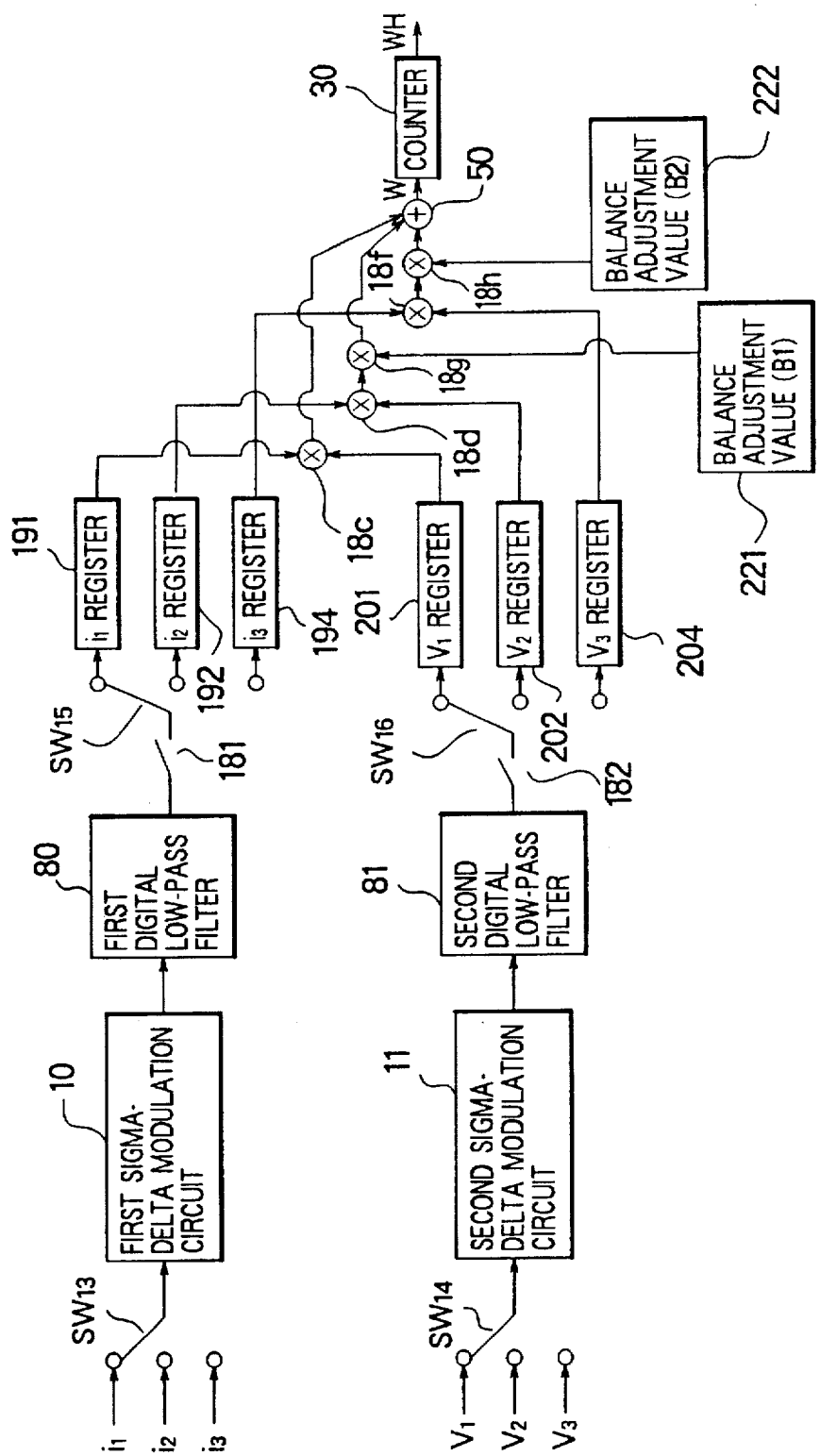
FIG. 24 shows a block diagram of an electric power calculation unit of an electronic watt-hour meter according to an embodiment 15 of the present invention.

The embodiment 15 shown in a block diagram of FIG. 24 provides an electronic watt-hour meter including balance adjustment means capable of carrying out a balance adjustment in the same way as the embodiment 14.

The embodiment 14 has the same arrangement as that of the embodiment 14 except that multipliers 18g, 18h for calculating B2 and B3 have different positions in the calculation circuit for calculating $w=(i_1 \times v_1)+(i_2 \times v_2) \times B2+(i_3 \times v_3) \times B3$. The operation of the embodiment 15 is also the same as that of the embodiment 14.

The embodiment 15 has the same advantage as that of the embodiment 14.

Embodiment 16

Figure 25:
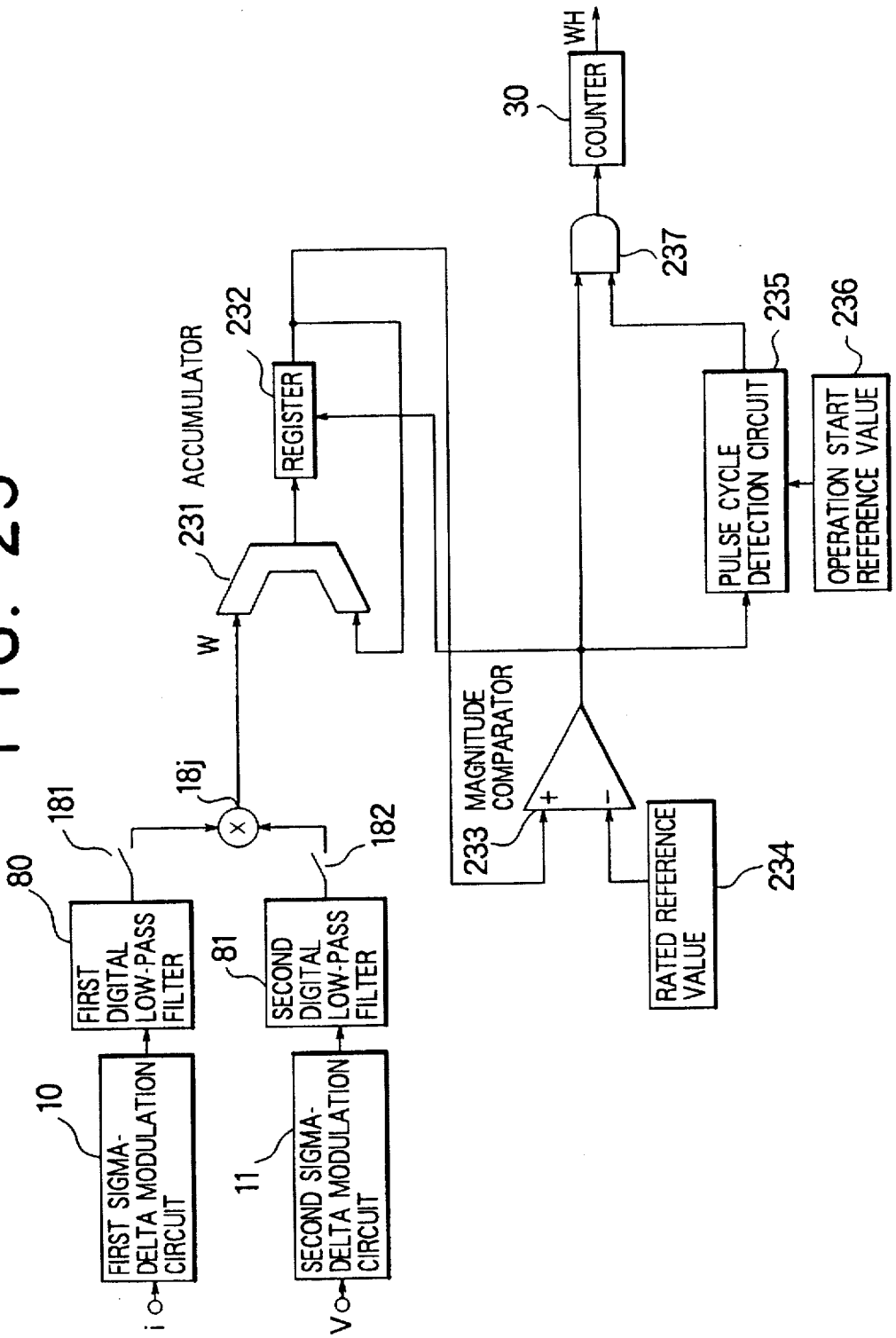
FIG. 25 shows a block diagram of an electric power calculation unit of an electronic watt-hour meter according to an embodiment 16 of the present invention.

The embodiment 16 provides an electronic watt-hour meter including potential operation preventing means for preventing the watt-hour meter from starting when no input is applied thereto. FIG. 25 is a block diagram showing a single-element watt-hour meter for measuring an electric energy of a single-phase two-wire system and FIG. 27a shows an operating waveform of the watt-hour meter.

In FIG. 25, first and second sigma-delta modulation circuits 10, 11 are the same as those shown in FIG. 2 or FIG. 3 and first and second digital low-pass filters are the same as that shown in FIG. 5.

An AC current signal i and an AC voltage signal v are subjected to A/D conversion by the sigma-delta modulation circuits 10, 11 and the first and second digital low-pass filters 80, 81. Current data and voltage data each subjected to the A/D conversion are multiplied by a multiplier 50 to calculate instantaneous electric power data. $W_n = W_0 + w_{n-1}$ ($w_n$: output value from the register 232 at a time tn, $W_{n-1}$: output value from the register 232 at a time $t_{n-1}$) is calculated from the instantaneous electric power data using its output ($W_0$) and an accumulator 231 and a register 232 on (FIG. 27a (1)).

Figure 27:
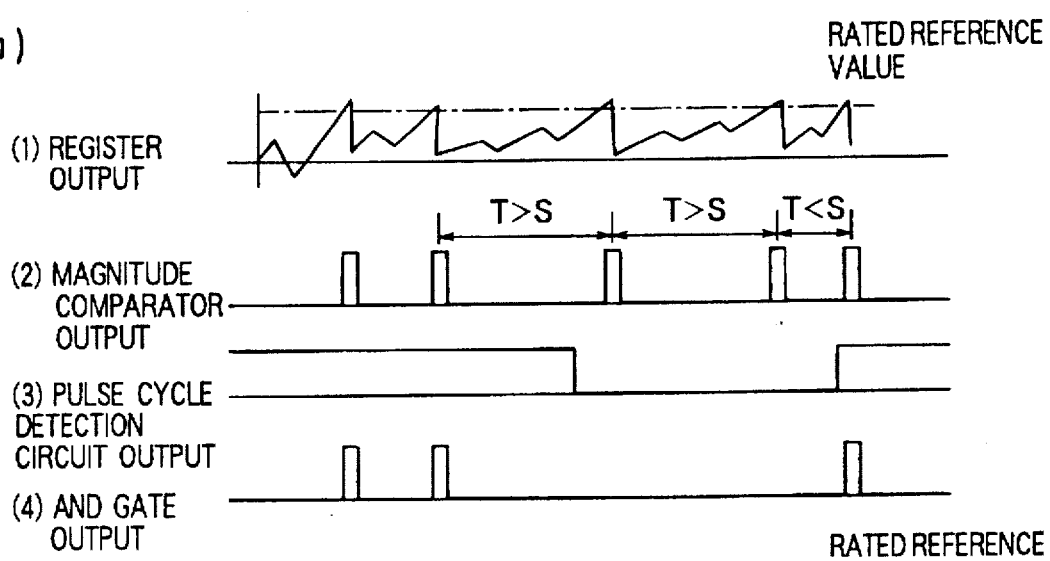
FIG. 27 shows a diagram explaining operation of FIG. 25 and FIG. 26.
Figure 27:
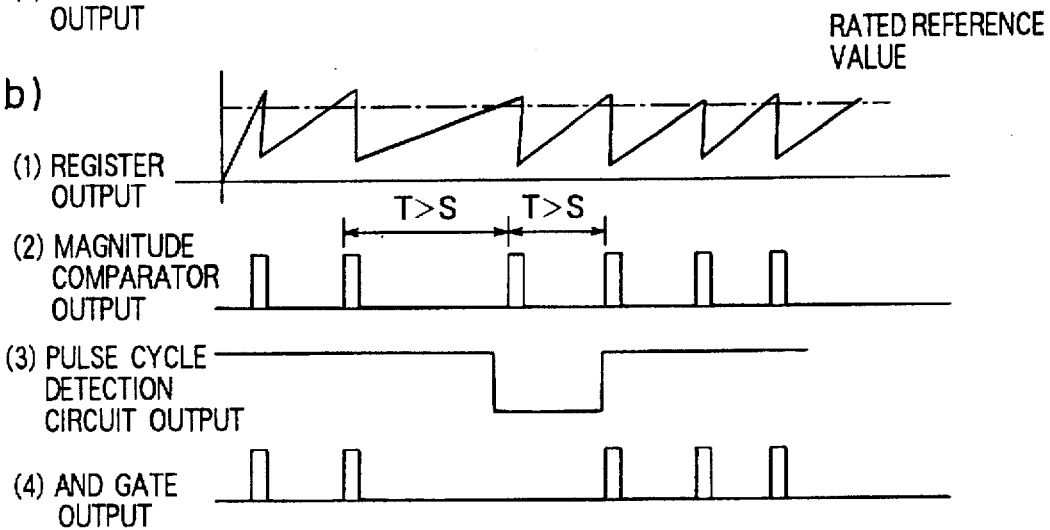

Note, the reason why an output from the register 232 exists on a minus side in the waveform shown in FIG. 27a (1) is that although the output exists only on a plus side when a power factor is 1, when the power factor is other than 1, a minus component which has the waveform as shown in the figure is produced as an instantaneous electric power.

In the case that the output value $w_n$ of the register 232 has a relationship, $w_n$-rated reference value≧0, when compared with a rated reference value set to a rated reference valued setting unit 234, a one pulse is output from a magnitude comparator 233 (FIG. 27a (2)) to set ($w_n$-rated reference value) to the register 232. On the other hand, a pulse output from the magnitude comparator 233 is compared with a start reference value (S) of a start reference value setting unit 236 by a pulse cycle detection circuit 235. When pulse output cycle (T)<S in the comparison, an output for opening an AND gate 273 is produced, whereas when pulse output cycle (T)≧S, an output for closing the AND gate 273 is produced (FIG. 27a (3)).

Therefore, when the pulse cycle is less than the start reference value, the AND gate 237 outputs pulses, whereas when the pulse cycle is equal or greater than the start reference value, the AND gate outputs no pulse (FIG. 27a (4)). A counter 30 cumulates the pulses to obtain an electric energy. More specifically, when the electric energy per unit time is small, the electric energy is not counted.

The embodiment 16 is advantageous in that since a start current is detected in such a manner that a pulse is output by the accumulator 231, the register 232 and the magnitude comparator 233 and a cycle of the pulse is detected, there is provided a potential operation preventing function for preventing unnecessary measurement due to a DC component at an analog unit when no current flows.

Embodiment 17

Figure 26:
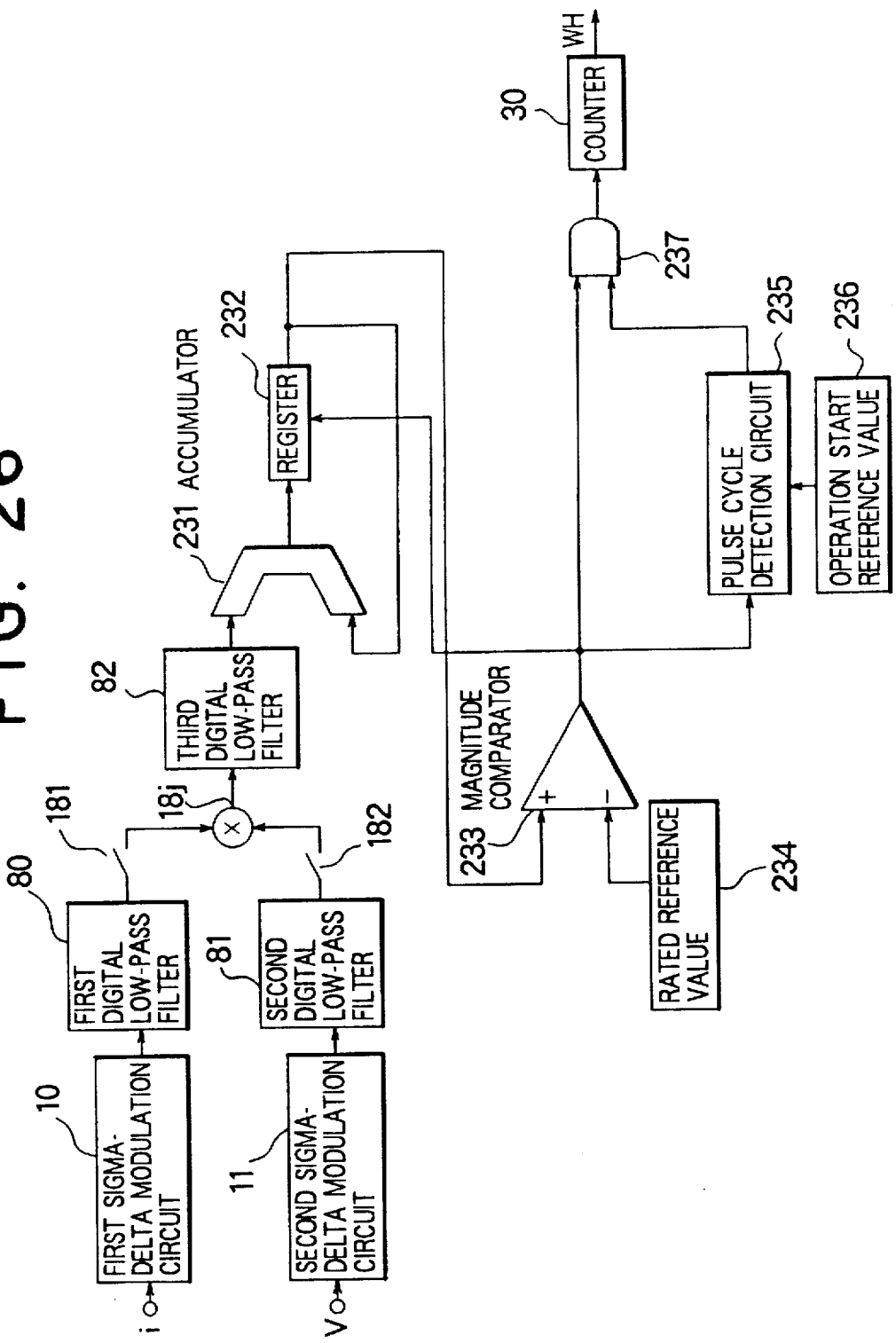
FIG. 26 shows a block diagram of an electric power calculation unit of an electronic watt-hour meter according to an embodiment 17 of the present invention.

The embodiment 17 provides an electronic watt-hour meter including a potential operation preventing means for preventing the watt-hour meter from starting when no input is applied thereto in the same way as the embodiment 16. FIG. 26 is a block diagram showing a single-element watt-hour meter for measuring an electric energy of a single-phase two-wire system and FIG. 27b shows an operating waveform of the watt-hour meter.

The embodiment 17 is arranged by adding a third digital low-pass filter 82 to the arrangement of the embodiment 16. $w_n = w_0 + w_{n-1}$ ($w_n$: an output value from a register 232 at a time tn, $w_{n-1}$: an output value from the register 232 at a time $t_{n-1}$) is calculated through the third digital low-pass filter 82 (FIG. 27b (1)). The operation of the embodiment 17 thereafter is the same as that of the embodiment 16. When passing through the third digital low-pass filter 82, an output from the register 232 is averaged as shown in FIG. 27b (1) and contributes to the improvement in the measuring precision.

The embodiment 17 is advantageous in that it can detect a high-precision start current by the addition of the third digital low-pass filter 82.

Embodiment 18

Figure 28:
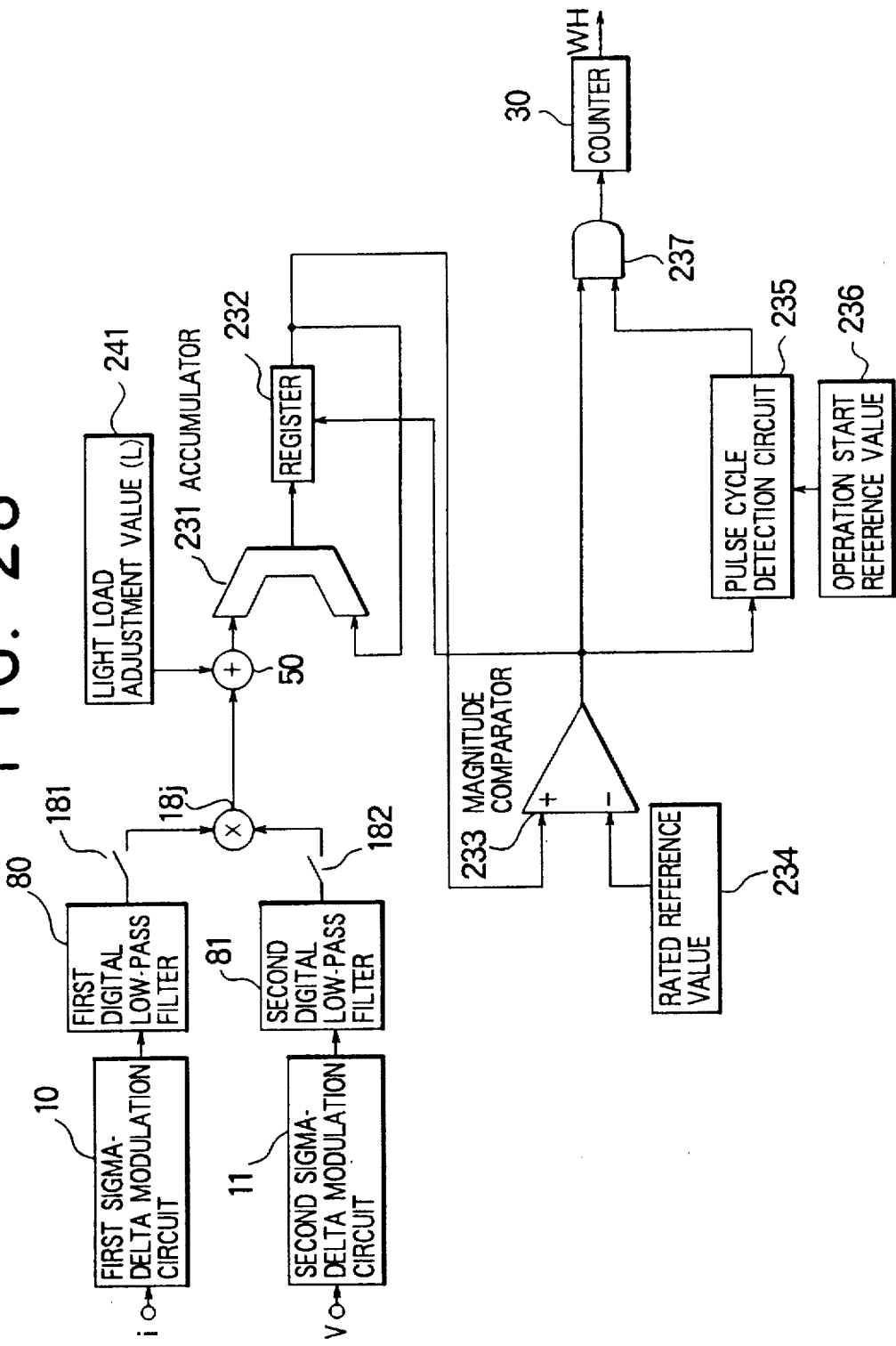
FIG. 28 shows a block diagram of an electric power calculation unit of an electronic watt-hour meter according to an embodiment 18 of the present invention.

The embodiment 18 shown in a block diagram of FIG. 28 provides an electronic watt-hour meter including a light load adjusting means for carrying out adjustment when a light load is applied.

The embodiment 18 is arranged by adding a light load adjustment setting unit (register) 241 and an adder 50 for adding a light load adjustment value to the arrangement of the embodiment 16 shown in FIG. 25.

Figure 29:
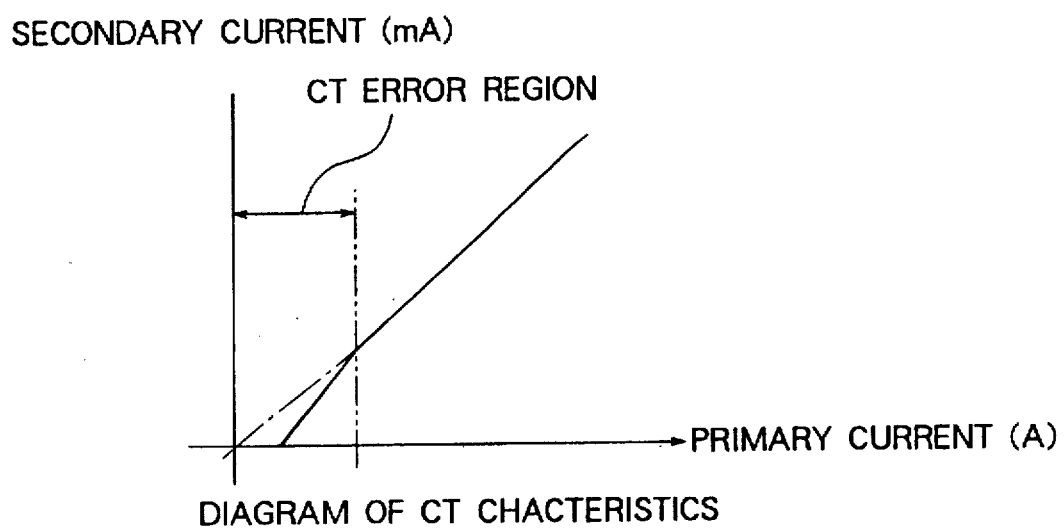
FIG. 29 is a graph showing output characteristics of a CT.

A light load adjustment is carried out by adding a light load adjustment value L in the light load adjustment setting unit 241 to a quantized electric power value which is an output from a multiplier 18j. The reason why the light load adjustment is carried out is that when a CT as an AC current detecting element is used, since a small current region has a tendency to have a minus error as shown in FIG. 29, a CT error is corrected by adding the certain value L by the light load adjustment register 241. When expressed by a formula, $w_n = (w_0 + L) + w_{n-1}$ ($w_n$: an output value from a register 232 at a time $t_n$, $W_{n-1}$: an output value from the register 232 at a time $t_{n-1}$). The operation of the embodiment 18 after the addition of the light load adjustment value is the same as that of the embodiment 16.

The light load adjustment value is also added in other regions as a certain value in addition to the region where the light load is applied. Since this value is relatively small, however, it can be ignored as a ratio of error in the other regions.

The embodiment 18 is advantageous in that it can provide a high-precision watt-hour meter by correcting a CT error when a light load is applied.

Embodiment 19

Although the embodiment 18 adds a light load adjustment value in regions other than the region in which a light load is applied, the embodiment 19 adds the light load adjustment value only when a light load is applied.

Figure 30:
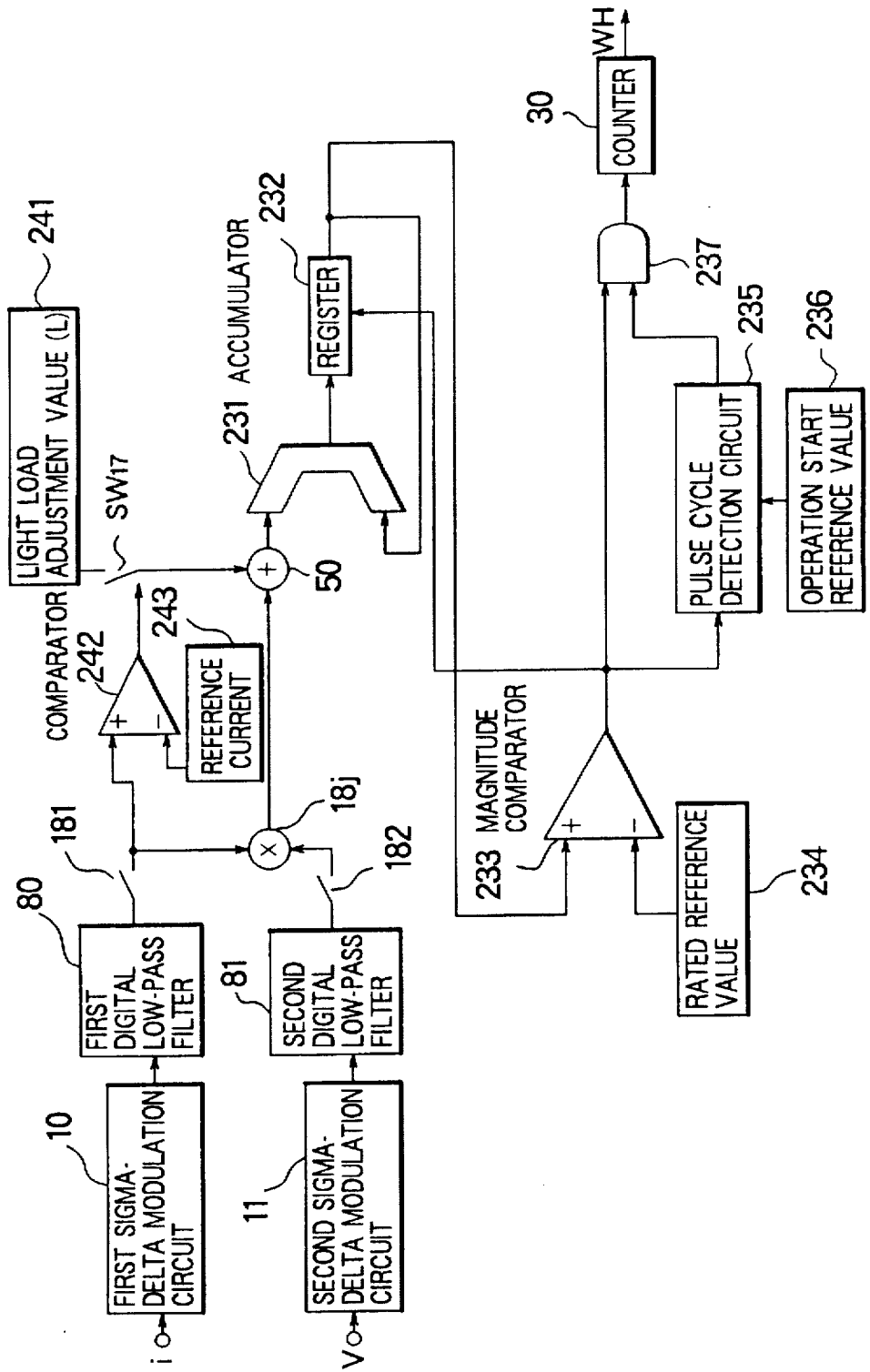
FIG. 30 shows a block diagram of an electric power calculation unit of an electronic watt-hour meter according to an embodiment 19 of the present invention.

In FIG. 30 showing the embodiment 19, numeral 242 denotes a comparator, numeral 243 denotes a reference current setting unit (register) for setting a reference current value, and numeral SW17 denotes a switch to be opened and closed by the comparator 242.

A light load adjustment value L is added depending upon a current value from a first digital low-pass filter 80. More specifically, when the current value is a light load and equal to or less than a reference current value, the comparator 242 does not operate and the switch S17 is connected to the light load adjustment setting unit to add the light load adjustment value. When the current value is other than the light load and greater than the reference current value, the comparator 242 operates and the switch SW17 is not connected to the light load adjustment setting unit so that no light load setting value is added. After the addition of the light load adjustment value, the embodiment 19 operates in the same way as the embodiment 16.

Although the embodiment 19 is as advantageous as the embodiment 18, since the light load adjustment value is added only when a light load is applied, the embodiment 19 can provide an electronic watt-hour meter of higher precision.

Embodiment 20

Figure 31:
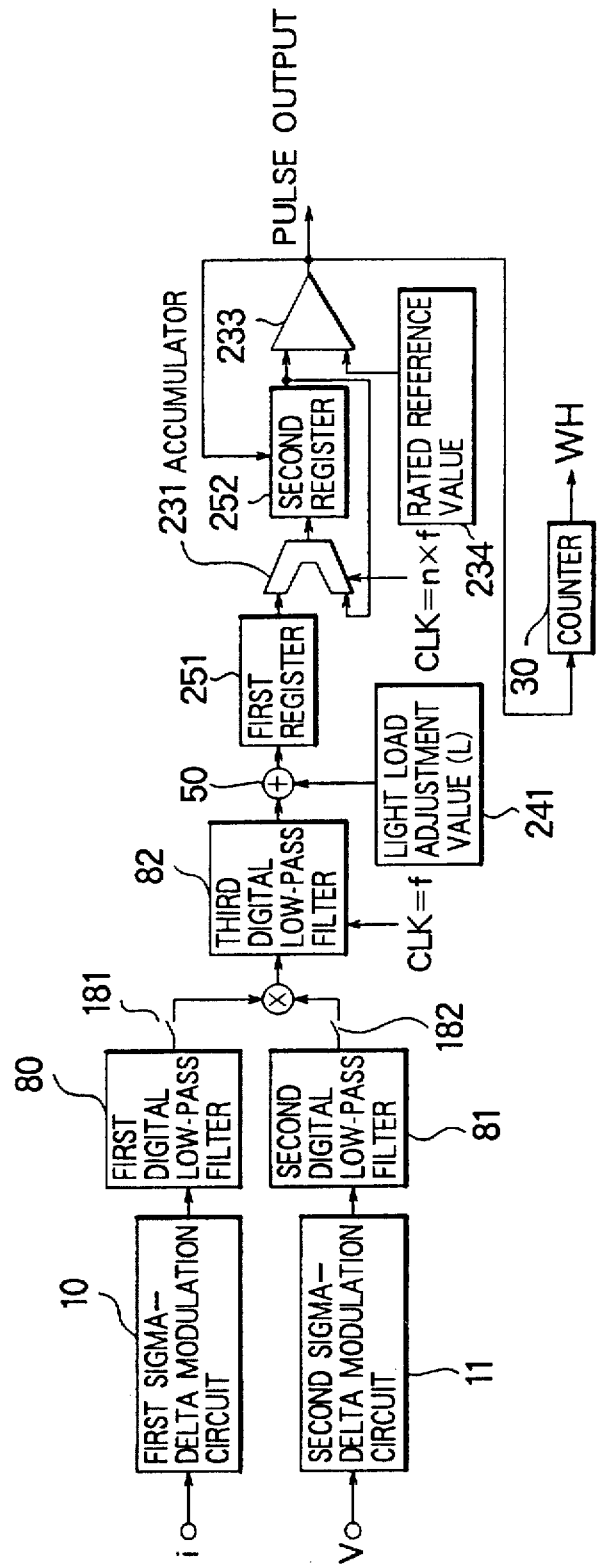
FIG. 31 shows a block diagram of an electric power calculation unit of an electronic watt-hour meter according to an embodiment 20 of the present invention.

The embodiment 20 shown in a block diagram of FIG. 31 provides an electronic watt-hour meter capable of measuring a measurement precision in a fine current region in a short time.

The embodiment 20 is arranged such that, in the arrangement of the embodiment 18, a third digital low-pass filter 82 is interposed between the multiplier 18j and the adder 50, a first register 251 is interposed between the adder 50 and the accumulator 231 to store a value $w_0+L$, and a second register 252 is connected to the output of the accumulator 231.

Next, operation of the embodiment 20 will be described. A result of the addition of an output from the third digital low-pass filter 82 to a light load is stored in a first register 251 in synchronism with an operation clock (CLK) frequency f. On the other hand, in the circuit following the accumulator 231, the operation clock (CLK) frequency is executed in synchronism with a speed f×n. That is, the value $(w_0+L)$ stored in the first register 251 is cumulated n times and stored in the second register 252. A magnitude comparator 233 disposed behind the second register 252 operates in the same way as the embodiment 18 and pulses are cumulated by a counter 30 to obtain an electric energy.

The embodiment 20 is advantageous in that pulse output intervals from the magnitude comparator are reduced and a measurement precision in a fine current region can be measured in a short time.

Although the light load adjustment value is added in the embodiment 20, this embodiment is also applicable to the embodiments 16 and 17 in which a light load adjustment setting unit is omitted and a similar advantage can be obtained.

Embodiment 21

Figure 32:
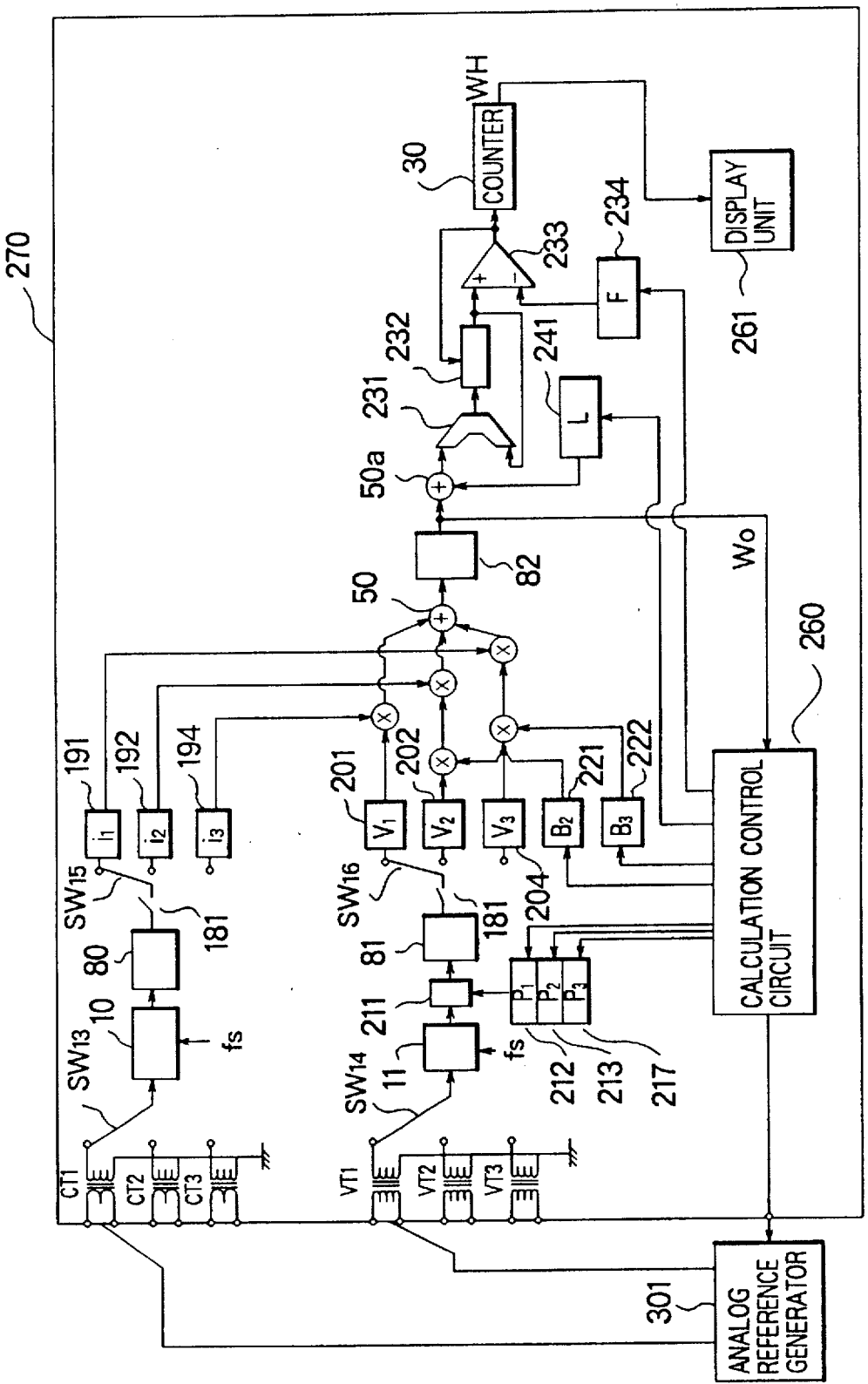
FIG. 32 shows a block diagram of an electric power calculation unit of an electronic watt-hour meter according to an embodiment 21 of the present invention.
Figure 33:
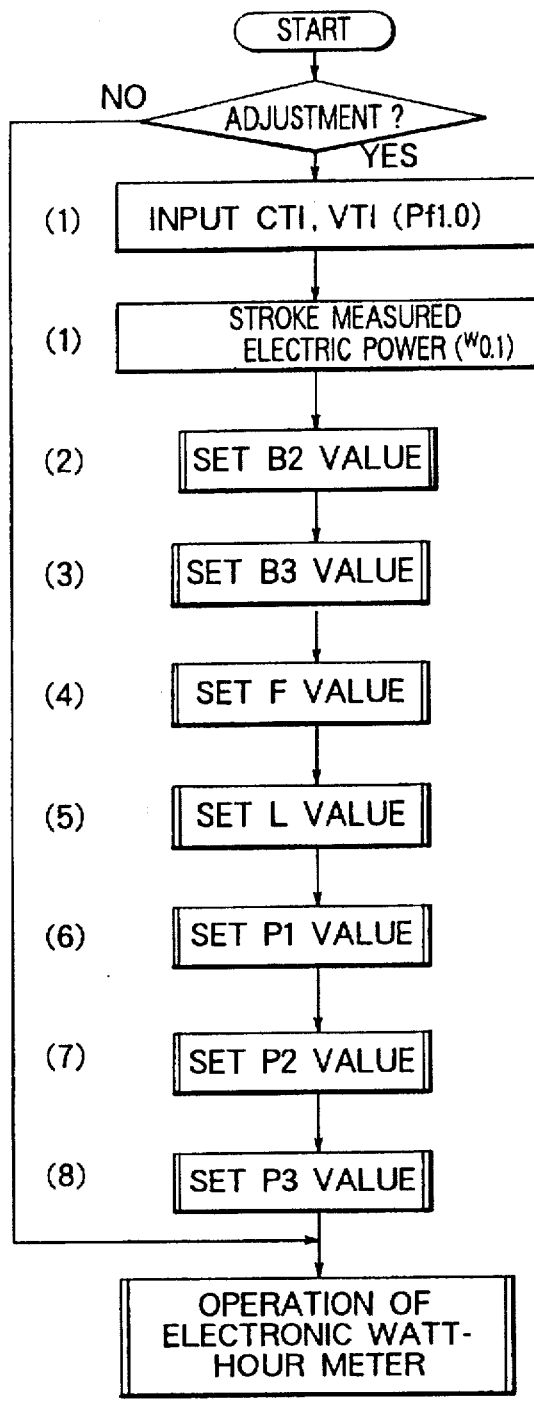
FIG. 33 is a flowchart showing adjustment operation of FIG. 32.
Figure 34:
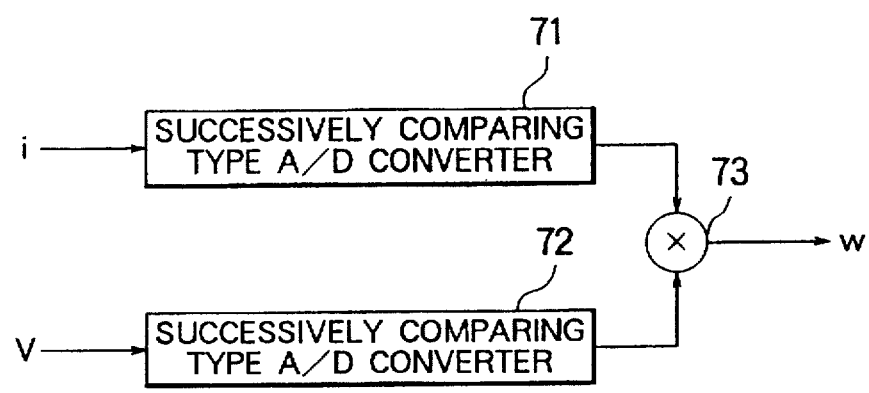
FIG. 34 shows a block diagram of an electric power calculation unit of a conventional electronic watt-hour meter.

The embodiment 21 is arranged as a typical electronic watt-hour meter for a three-phase four-wire system and includes adjustment means necessary to the measurement of an electric energy of the system so that a necessary adjustment can be carried out by the adjustment means. FIG. 32 shows a block diagram of the embodiment 21 and FIG. 33 shows a flowchart of the adjustment.

The same numerals as used in the aforesaid embodiments are used in the arrangement of the embodiment 21 to denote parts having the same functions as those of the aforesaid embodiments. Numeral 261 denotes a display unit for displaying a cumulated electric energy, numeral 260 denotes an calculating operation control circuit for controlling an entire calculating operation, numeral 270 denotes the electronic watt-hour meter as a whole, and numeral 301 denotes an analog reference generator for inputting a reference input. Numeral 241 denotes a light load adjustment value setting unit for setting a light load adjustment value L and numeral 234 denotes a rated reference value setting unit for setting a rated reference value F.

Operation of embodiment 21 will now be described. First, prior to the continuous measurement of an electric energy, the arithmetic operation control circuit 260 has an adjustment mode and carries out the following operation.

(1) The same analog value (e.g., 100% for both of a current and a voltage) is entered from the analog reference generator 301 to a CT1 and a VT1. Note, an entire circuit is operated in the state that CT2, CT3, VT2, VT3=0 and an output $(w_0)$ from a third digital low-pass filter 82 at the time is stored [this value is referred to as $w_{01}$].

(2) The above same analog value is entered to the CT2 and the VT2. Note, the entire circuit is operated in the state that CT1, CT3, VT1, VT3=0 and an output $(w_0)$ from the third digital low-pass filter 82 at the time is read [this value is referred to as $w_{02}$] and a value $B2=w_{01}/w_{02}$ is set to a balance adjustment register 221.

(3) The above same analog value is entered to the CT3 and the VT3. Note, the entire circuit is operated in the state that CT1, CT2, VT1, VT2=0 and an output $(w_0)$ from the third digital low-pass filter 82 at the time is read [this value is referred to as $w_{03}$] and a value $B3=w_{01}/w_{03}$ is set to a balance adjustment register 222.

(4) The above same value is entered from the analog reference generator 301 to the CT1 and the VT1 and a value F=$(w_{01}$/reference electric power)×(rated reference value) is set to the rated reference value setting unit 234.

The reference electric power means a calculated value which is obtained by multiplying a voltage from the analog reference generator 301 by a current therefrom, and the rated reference value means a calculated value (constant) for determining the number of pulses per unit electric energy. F means a corrected rated reference value and is set as a new rated reference value. More specifically, an input electric energy (a value of the register 232) becomes an electric energy corrected based on F (an output from a magnitude comparator) and thus a precise electric energy (the value of a counter 30) is measured.

(5) The value entered in (1) is entered to the VT1, a value of 1/n the analog value entered in (1) is entered to the CT1. Note, CT2, CT3, VT2, VT3= 0. A value $L=(w_{01}/n)-w_{0n}$ is set to a light load adjustment value setting unit as a light load adjustment value from an output $(w_0)$ from the third digital low-pass filter 82 at the time [this value is referred to as $w_{0n}$].

(6) An analog signal having the same effective value and a power factor=0.5 is entered to the CT1 and the VT1. Note, CT2, CT3, VT2, VT3=0. A value $P1=K\cdot(w_{01}/2-w_{0P1})\,w_{01}/2$ is set to a P1 register 212 from an output $(w_0)$ from the third digital low-pass filter 82 at the time [this value is referred to as $w_{0P1}$] (K: constant).

(7) An analog signal having the same effective value and a power factor=0.5 is entered to the CT2 and the VT2. Note, CT1, CT3, VT1, VT3=0. A value $P2=K\cdot(w_{01}/2-W_{0P2})\,w_{01}/2$ is set to a P2 register 213 from an output $(w_0)$ from the third digital low-pass filter 82 at the time [this value is referred to as $W_{0P2}$] (K: constant).

(8) An analog signal having the same effective value and a power factor=0.5 is entered to the CT3 and the VT3. Note, CT1, CT2, VT1 , VT2=0. A value $P3=K\cdot(w_{01}/2-W_{0P3})\,w_{01}/2$ is set to a P3 register 217 from an output $(w_0)$ from the third digital low-pass filter 82 at the time [this value is referred to as $w_{OP3}$] (K: constant).

The respective setting values are set in the sequence of (1)–(8) and thereafter an electric energy is measured based on the determined set values.

FIG. 33 shows a flowchart of the adjustment operation, wherein items (1)–(8) in the figure correspond to the above adjustments effected in (1)–(8). An adjustment job can be automatically carried out according to the flowchart.

Note, when a VT and CT having characteristics (specific error) within a predetermined range can be made, the balance adjustment in (2) and (3) is not needed. When a CT having excellent light load characteristics is used, the light load adjustment in (5) is not needed. When a VT and CT having phase angle characteristics within a predetermined range can be made, the phase angle adjustment in (6), (7) and (8) is not needed.

On the other hand, the constant K set in (6), (7), (8) is a constant determined by a sampling frequency $f_s$ and a commercially available frequency $f_0$ and expressed as follows on the premise that a phase angle error is 1 minute and an electric power error is about 0.05%.

$$K=100/360\times60\times0.05\times(f_0/f_s)$$

This embodiment is advantageous in that since the respective adjustment values are set and stored as digital values, an electronic watt-hour meter can be made in an automated line which does not need manpower and thus its cost can be reduced.

In summary, the electronic watt-hour meter according to a first aspect of the invention comprises first and second analog to digital conversion means for quantizing an AC current and an AC voltage, respectively, first and second moving average processing means for determining a moving average of each of the quantized AC current and the quantized AC voltage, first multiplication means for multiplying the AC current and the AC voltage each subjected to the moving average processing, and cumulation means for cumulating outputs from the multiplication means.

The electronic watt-hour meter according to a second aspect of the invention is provided with thinning-out means for thinning out the quantized AC current and the quantized AC voltage each having been subjected to said moving average processing from the sampled value train thereof at a ratio of 1/n ($n \geq 1$).

The electronic watt-hour meter according to a third aspect of the invention is arranged such that the analog to digital conversion means of the invention a sigma-delta modulation circuit for integrating an analog input value by an integrator and outputting a digital value through a comparator as well as delaying and digital to analog converting the output so that the output is fed back to the input of the integrator and the electronic watt-hour meter comprises switching means for switching a plurality of inputs at a predetermined cycle and successively inputting the respective inputs to the sigma-delta modulation circuit and holding means for holding integrated values which are successively integrated by the integrator in synchronism with the switching cycle of the switching means in correspondence with the plurality of the respective inputs, respectively.

The electronic watt-hour meter according to a fourth aspect of the invention is arranged such that the first and second moving average processing means has an output of 8 bits or less.

The electronic watt-hour meter according to a further aspect of the invention comprises first analog to digital conversion means for quantizing an AC current, second analog to digital conversion means for quantizing an AC voltage, first and second digital low-pass filters for causing the quantized AC current and AC voltage to pass through a low-pass region, respectively, thinning-out means for thinning out the quantized current and the quantized voltage each having been subjected to the low-pass filtration from the sampled value train thereof at a ratio of 1/m (m: a number larger than the number of delay means of the first and second digital low-pass filters), first multiplication means for multiplying an AC current and an AC voltage from the thinning-out means, and cumulation means for cumulating outputs from the multiplication means.

The electronic watt-hour meter according to a sixth aspect of the invention is provided with first and second integration means for integrating each one cycle of a quantized AC current and a quantized AC voltage, second multiplication means for multiplying outputs from the respective integration means, and subtracting means for subtracting an output from the second multiplication means from an output from the first multiplication means.

The electronic watt-hour meter according to a seventh aspect of the invention is provided with zero-cross detection means for detecting one cycle of a quantized AC current and a quantized AC voltage by a zero-cross point of the AC voltage, first and second integration means for integrating each one cycle of the quantized AC current and the quantized AC voltage based on an output from the zero-cross detection means, second multiplication means for multiplying outputs from the respective integration means, and subtracting means for subtracting an output from the second multiplication means from an output from the first multiplication means.

The electronic watt-hour meter according to an eighth aspect of the invention comprises switching means for successively fetching AC currents and AC voltages of respective elements having multiple inputs from input AC currents and AC voltages of the corresponding elements at a predetermined cycle, first analog to digital conversion means and second analog to digital conversion means for successively quantizing AC currents and AC voltages of the respective elements from the switching means, first and second digital low-pass filters for causing the quantized AC currents and AC voltages of the respective elements to successively pass through a low-pass region, thinning-out means for thinning out the quantized currents and the quantized voltages of the respective elements each having been subjected to the low-pass filtration from the sampled value train thereof at a ratio of 1/m (m: a number larger than the number of delay means of the first and second digital low-pass filters), calculation means for multiplying AC currents and AC voltages which correspond to the multiple inputs and are supplied from the thinning-out means and determining sums of the multiplication results, and cumulation means for cumulating outputs of the sums.

The electronic watt-hour meter according to a ninth aspect of the invention is arranged such that the first and second low-pass filters are filters each having an output of 8 bits or less.

The electronic watt-hour meter according to a tenth aspect of the invention is provided with an offset adjustment means for subtracting an offset electric power value from a quantized electric power value.

The electronic watt-hour meter according to an eleventh aspect of the invention is provided with an offset adjustment means for subtracting an offset electric power value from a quantized electric power value.

The electronic watt-hour meter according to a twelfth aspect of the invention is provided with delay means capable of obtaining a desired delay time interposed between the second analog to digital conversion means and the second digital low pass filter.

The electronic watt-hour meter according to thirteenth aspect of the invention is provided with delay means capable of obtaining a desired delay time interposed between the first analog to digital conversion means and the first digital low pass filter.

The electronic watt-hour meter according to a fourteenth aspect of the invention is arranged such that the delay means is a shift register capable of carrying out the desired number of shifts.

The electronic watt-hour meter according to a fifteenth aspect of the invention is provided with a balance adjustment means for multiplying quantized electric power values of respective 2, 3, . . . n elements by balance adjustment values B2, B3, . . . Bn in a case of multi-element inputs for inputting AC currents and AC voltages of n elements.

The electronic watt-hour meter according to a sixteenth aspect of the invention is provided with a potential operation preventing means for resetting a cumulated value of quantized electric power values each time the cumulated value exceeds a preset rated reference value to repeat cumulation as well as measuring a time until the cumulated value of the electric power values exceeds the rated reference value, and not measuring electric power values within the measuring time when the time exceeds a predetermined time.

The electronic watt-hour meter according to a seventeenth aspect of the invention is provided with a third low-pass filter for causing a quantized electric power to pass through a low-pass region.

The electronic watt-hour meter according to an eighteenth aspect of the invention is provided with a light load adjustment means for adding a predetermined light load adjustment value to a quantized electric power at least when a light load is applied.

The electronic watt-hour meter according to a nineteenth aspect of the invention is provided with a third digital low-pass filter operating at a predetermined clock cycle frequency f and causing a quantized electric power value to pass through a low-pass region, a first register for storing an output value having passed through the third digital low-pass filter, a second register for operating at an operating clock frequency f×n and adding a value of the first register n times and storing a resulting value, and comparison means for comparing a value output from the second register with a preset rated reference value at the operating clock cycle f×n and sending an output for calculating an electric energy each time a compared result exceeds the rated reference value.

The electronic watt-hour meter according to a twentieth aspect of the invention is provided with rating adjustment means for outputting an inputted electric energy as an electric energy corrected based on a rated reference value.

The electronic watt-hour meter according to a twenty-first aspect of the invention comprises switching means for successively switching at a predetermined cycle and outputting respective currents and voltages entered from a first phase, a second phase and a third phase;

first and second analog to digital conversion means for quantizing AC currents and AC voltages of the respective phases output from the switching means, respectively;

first and second digital low-pass filters for causing the quantized AC currents and the quantized AC voltages of the respective phases to pass through a low-pass region, respectively;

thinning-out means for thinning out the quantized AC currents and the quantized AC voltages of the respective phases each having been subjected to the low-pass filtration from the sampled value train thereof at a ratio of 1/m;

calculation means for multiplying the AC currents of the respective phases from the thinning means by the AC voltages of the respective phases from the thinning means, respectively and determining sums of the multiplication results;

third low-pass filter for causing the outputs of the sums to pass through a low-pass region;

cumulating means for cumulating an output from the third digital low-pass filter; as well as at least one of the following adjustment means:

(1) balance adjustment means including first and second balance adjustment registers for multiplying quantized electric power values of a second phase and a third phase determined from an AC current and an AC voltage of a usual object to be measured by balance adjustment value B1, B2, respectively and setting a value $B2=w_{O1}/w_{O2}$ to the first balance adjustment register and setting a value $B3=w_{O1}/w_{O3}$ to the second balance adjustment register, where an output from the third digital low-pass filter is represented by $W_{O1}$ at the time when a predetermined analog value of the same phase is input as a current-voltage value of the first phase, the analog value is input as a current-voltage value of the second phase and an output from the third digital low-pass filter at the time is represented by $w_{O2}$, and the analog value is input as a current-voltage value of the first phase and an output from the third digital low-pass filter at the time is represented by $w_{O3}$;

(2) rating adjustment means including a register for cumulating outputs from the third digital low-pass filter and an F value setting register for setting a value F=($w_{O1}$/reference electric power)×(rated reference value) (where, reference electric power=value produced in calculation determined by reference voltage reference current, and rated reference value= value in calculation for determining the number of pulses per unit of electric energy (constant)), and sending an output for measuring an electric energy each time the cumulated value exceeds the F value as well as resetting the register;

(3) light load adjustment means including a light load adjustment register for adding a set light load adjustment value to an output value from the third digital low-pass filter and setting a value $L=(w_{O1}/nm)-w_{On}$ in the light load adjustment register as a light load adjustment value, where an output from the digital low-pass filter is represented by $w_{On}$, at the time when a value of 1/n (n≧1), a current analog value input in the (1) is input as a current input of the first phase as well as a value of 1/m (m≧1), and a voltage analog value input in the (1) is input as a voltage input of the second phase; and (4) phase adjustment means including a shift register capable of carrying out the desired number of shifts interposed between the second analog to digital conversion means and the second digital low-pass filter and respective registers P1, P2, P3 for designating the number of shifts of the shift register and carrying out phase adjustment by successively shifting respective phases to values P1, P2, P3 by the shift register in synchronism with the switching means, where an output from the third low-pass filter is represented by $W_{OP1}$ at the time when an analog value having the same effective value as that of the analog value of the (1) and a power factor=1 is input as an input of the first phase and a value $P2=K(W_{O1}\times 0.5)-W_{OP2}$ is set to the P1 shift register, and an output from the third low-pass filter is represented by $W_{OP3}$ at the time when an analog value having the same effective value as that of the analog value of the (1) and a power factor=1 is input as an input of a second phase and a value $P2=K(W_{O1}\times 0.5)-W_{OP2}$ is set to the P1 shift register, and an output from the third low-pass filter is represented by $W_{OP3}$ at the time when an analog value having the same effective value as that of the analog value of the (1) and power factor=1 is input as an input of the second phase and a value $P3=K(W_{O1}\times 0.5) W_{OP3}$ is set to the P1 shift register.

A AC current and an AC voltage as analog values are quantized by the first and second analog to digital conversion means, the quantized signals are subjected to a moving average processing by the first and second moving average processing means, signals corresponding to the current and voltage, respectively are multiplied by the multiplier to obtain signals corresponding to electric powers and the signals are cumulated to obtain a high precision electric energy.

A thinning-out operation is carried out by the 1/n thinning-out means ($n\geq 1$) to thin out the quantized AC current and the quantized AC voltage at a ratio of 1/n from the sampled value train thereof to reduce the number of calculation.

A plurality of inputs are switched by the switching means at a predetermined cycle and successively entered to the sigma-delta modification circuit, the entered analog values are integrated by the integrator in the sigma-delta modification circuit and digital values are output through the comparator as well as fed back to the input of the integrator by being delayed and subjected to a D/A conversion. Then, integrated values successively integrated by the integrator in synchronism with a switching cycle of the switching means are held by the holding means in correspondence with the plurality of the inputs and the integration of the plurality of the inputs by the integrator and the holding of the integrated values by the holding means are successively carried out at the above predetermined cycle and the results of the processings are output, so that the plurality of the inputs are processed by the single set of the sigma-delta modulation circuit.

The first and second moving average processing means can measure an electric energy within a predetermined precision by an output of 8 bits or less.

An AC current is digitized by the first analog to digital conversion means, an AC voltage is digitized by the second analog to digital conversion means, the digitized AC current and AC voltage are caused to pass through a low-pass region by the first and second low-pass filters, respectively, the AC current and AC voltage having been passed through the low-pass region are thinned out from the sampled value train thereof by the thinning-out means at a ratio of 1/m (m: a number larger than the number of delay means of the first and second digital low-pass filters), the AC current and AC voltage from the thinning-out means are multiplied by the first multiplication means, and outputs from the multiplication means are cumulated by the cumulation means to thereby obtain a high-precision electric energy.

Each one cycle of an AC current and an AC voltage quantized by the first and second integration means is integrated by the first and second integration means, outputs therefrom are multiplied by the second multiplication means, and an output from the second multiplication means is subtracted from an output from the first multiplication means by the subtraction means to thereby reduce an electric power calculation error caused by the effect of a direct current component.

Since a zero-cross point of an AC voltage is detected by the zero-cross detection means and each one cycle of a quantized AC current and AC voltage is detected based on the detection of the zero-cross point and an integrated value of each one cycle of the quantized AC current and an integrated value of each one cycle of the quantized AC voltage are output by the first and second integration means, even if a frequency varies, an effect of a direct current component of a current and a voltage can be removed.

AC currents and AC voltages of respective multi-elements are successively fetched at a predetermined cycle from AC currents and AC voltages of the corresponding multi-elements entered by the switching means, the AC currents and AC voltages of the respective elements from the switching means are successively quantized by the first analog to digital conversion means and the second analog to digital conversion means, caused to successively pass through the low-pass region by the first and second digital low-pass filters, and thinned out by the thinning-out means at a ratio of 1/m (m: a number larger than the number of delay means of the first and second digital low-pass filters), AC currents and AC voltages from the thinning-out means which correspond to the multi-element inputs are multiplied, respectively, sums of the multiplied results are determined by the calculation means and outputs of the sums are cumulated by the cumulation means to obtain an electric energy.

The first and second digital low-pass filters measure an electric energy within a predetermined precision by an output of 8 bits or less.

An offset electric power is calculated from a quantized offset current and a quantized offset voltage each determined by entering a reference current and a reference voltage and the result of calculation is set as the offset electric power value to the offset adjustment means and an offset adjustment is carried out by subtracting the offset electric power value from the quantized electric power value.

An offset electric power is calculated from a quantized offset current and a quantized offset voltage determined by entering a reference current and a reference voltage at a predetermined cycle and the result of calculation is set as the offset electric power value to the offset adjustment means at each predetermined cycle and an offset adjustment is carried out by subtracting the offset electric power value from the quantized electric power value.

A voltage phase angle is adjusted by the delay means to thereby correct a phase angle error.

A a current phase angle is adjusted by the delay means to thereby correct a phase angle error.

A phase angle is adjusted by the shift register capable of carrying out the desired number of shifts to thereby correct a phase angle error.

In a case of multi-elements inputs for entering AC currents and AC voltages of n elements, respective balance adjustment values $B2=W_1/W_2$, $B3=W_1/W_3, \ldots Bn=W_1/W_n$ are set, where quantized electric power values which are measured by applying a reference current and a reference voltage to inputs of respective first, second, third, . . . n-th elements through B2, B3, . . . Bn balance adjustment registers are represented by $W_1, W_2, W_3, \ldots W_n$.

A balance adjustment is carried out in such a manner that the respective balance adjustment values are multiplied through the multiplication means by the quantized electric power values of the respective second, third, . . . n-th elements determined from an AC current and an AC voltage of a usual object to be measured.

Each time a cumulated value of a quantized electric power value exceeds a preset rated reference value, the cumulated value is reset to repeat cumulation as well as a time until the cumulated value of the electric power values exceeds the rated reference value is measured, and when the time exceeds a predetermined time, electric power values within the measuring time are not measured for the prevention of a potential operation to thereby reduce a measuring error in the state of no entered electric energy.

A potential operation of outputs having passed through the third digital low-pass filter is prevented to thereby reduce a measurement error in the state of no entered electric energy.

A predetermined light load adjustment value is added to a quantized electric power value at least when a light load is applied to thereby reduce a measuring error in the light load.

An electric power value quantized by the third digital low-pass filter operating at a predetermined operating clock frequency f is caused to pass through the low-pass region and stored in the first register. The value of the first register is added n times and a resulting value is stored in the second register operating at an operating clock frequency f×n. The value of the second register is compared with the preset rated reference value at an operating clock frequency of f×n and each time the value exceeds the rated reference value, an output for measuring an electric energy is sent by the comparison means to thereby measure a measuring precision in a short time.

A previously set rated reference value is corrected in accordance with a ratio of a reference electric power value obtained in an actual measurement by inputting a reference current and a reference voltage to a reference electric power value calculated by multiplying the reference current by the reference voltage, the corrected rated reference value is set as the rated reference value of the rating adjustment means, and electric energies entered based on the rated reference value are output as corrected electric energies to thereby measure a precise electric energy by cumulating the outputs.

Respective currents and voltages entered from a first phase, a second phase and a third phase are successively switched at a predetermined cycle and output by the switching means, and AC currents and AC voltages of the respective phases are quantized by the first and second analog to digital conversion means, respectively. Next, the quantized AC currents and AC voltages are caused to pass through the low-pass region by the first and second digital low-pass filters, the quantized AC currents and the quantized AC voltages of the respective phases each having been subjected to the low-pass filtration are thinned out by the thinning-out means from the sampled value train thereof at a ratio of 1/m, the AC currents and the AC voltages of the respective phases from the thinning-out means are multiplied, respectively and the sums of the results of multiplication are determined by the calculation means, and outputs of the sums are caused to pass through the low-pass region by the third low-pass filter and cumulated by the cumulation means. At the same, the result of cumulation is adjusted by using at least one of the following adjustment means (1), (2), (3), (4).

(1) balance adjustment means including first and second balance adjustment registers for multiplying quantized electric power values of a second phase and a third phase determined from an AC current and an AC voltage of a usual object to be measured by balance adjustment value B1, B2, respectively and setting a value $B2=W_{o1}/W_{o2}$ to the first balance adjustment register and setting a value $B3=W_{o1}/W_{o3}$ to the second balance adjustment register, where an output from the third digital low-pass filter is represented by wo, at the time when a predetermined analog value of the same phase is input as a current-voltage value of the first phase, the analog value is input as a current-voltage value of the second phase and an output from the third digital low-pass filter at the time is represented by $W_{o2}$, and the analog value is input as a current voltage value of the first phase and an output from the third digital low-pass filter at the time is represented by $W_{o3}$;

(2) rating adjustment means including a register for cumulating outputs from the third digital low-pass filter and an F value setting register for setting a value $F=(W_{o1}/$ reference electric power)×rated reference value (where, reference electric power produce in calculation determined by reference voltage-reference current, and rated reference value=value in calculation for determining the number of pulses per unit of electric energy (constant)), and sending an output for measuring an electric energy each time the cumulated value exceeds the F value as well as resetting the register;

(3) light load adjustment means for including a light load adjustment register for adding a set light load adjustment value to an output value from the third digital low-pass filter and setting a value $L=(W_{o1}/nm)-W_{o1}$ to the light load adjustment register as a light load adjustment value, where an output from the digital low-pass filter is represented by wo, at the time when a value of 1/n (n≧1) a current analog value entered in the (1) is entered as a current input of the first phase as well as a value of 1/m (m≧1) a voltage analog value entered in the (1) is entered as a voltage input of the second phase; and (4) phase adjustment means including a shift register capable of carrying out the desired number of shifts interposed between the second analog to digital conversion means and the second digital low-pass filter and respective registers P1, P2, P3 for designating the number of shifts of the shift register and carrying out phase adjustment by successively shifting respective phases to values P1, P2, P3 by the shift register in synchronism with the switching means, where an output from the third low-pass filter is represented by $W_{oP1}$ at the time when an analog value having the same effective value as that of the analog value of the (1) and a power factor=1 is input as an input of the first phase and a value of $P1=K(W_{o1}\times0.5)-W_{oP1}$ (K: constant) is set to the P1 shift register, an output from the third low-pass filter is represented by $W_{oP2}$ at the time when an analog value having the same effective value as that of the analog value of the (1) and a power factor=1 is input as an input of a second phase and a value $P2=K(W_{o1}\times0.5)-W_{oP2}$ is set to the P1 shift register, and an output from the third low-pass filter is represented by W-P3 at the time when an analog value having the same effective value as that of the analog value of the (1) and power factor=1 is input as an input of the second phase and value $P3=K(W_{o1}\times0.5)-W_{oP3}$ is set to the P1 shift register.

According to the first aspect of the present invention, there is provided a high-precision electronic watt-hour meter by which a quantized noise in a low frequency region can be greatly reduced to thereby reduce an electric power error.

According to the second aspect of the present invention, since data is thinned out at a ratio of 1/n (n≧1), the number of multiplications can be reduced, which is advantageous in that a power consumption of a circuit can be reduced.

According to the third aspect of the present invention, an advantage is obtained in that a plurality of inputs can be processed by a single sigma-delta modulation circuit and a circuit arrangement can be simplified by using time division.

According to the fourth aspect of the present invention, an advantage is obtained in that first and second moving average processing means can measure an electric energy within a predetermined precision range by an output of 8 bits or less.

According to the fifth aspect of the present invention, there is provided a high-precision electronic watt-hour meter by which a quantized noise in a low frequency region can be greatly reduced to thereby reduce an electric power error.

According to the sixth aspect of the present invention, since a moving average of one cycle of an output from an analog to digital conversion means is determined, there is an advantage that an electric power calculation error due to a direct current component can be reduced.

According to the seventh aspect of the present invention, since a zero-cross point of an AC voltage is detected by zero-cross detection means and each one cycle of a quantized AC current and an AC voltage is detected based thereon, there is an advantage that even if a frequency varies, an effect of a direct current component of a current and a voltage can be removed.

According to the eighth aspect of the present invention, an advantage is obtained in that a plurality of inputs can be processed by a single sigma-delta modulation circuit and a circuit arrangement can be simplified by using time division.

According to the ninth aspect of the present invention, an advantage is obtained in that first and second low-pass filters can measure an electric energy within a predetermined precision range by an output of 8 bits or less.

According to the tenth aspect of the present invention, since offset adjustment means is provided, a measuring precision can be improved by correcting an offset electric power value.

According to the eleventh aspect of the present invention, since an offset electric power is calculated at a predetermined cycle and an offset value is corrected, at all times, there is an advantage that a measuring precision can be more improved.

According to the twelfth aspect of the present invention, since a phase angle error is corrected by adjusting a voltage phase angle by delay means, there is an advantage that a measuring precision can be improved.

According to the thirteenth aspect of the present invention, since a phase angle error is corrected by adjusting a current phase angle by delay means, there is an advantage that a measuring precision can be improved.

According to the fourteenth aspect of the present invention, since a phase angle error is corrected by adjusting a phase angle by a shift register capable of carrying out the desired number of shifts, there is an advantage that a measuring precision can be improved.

According to the fifteenth aspect of the present invention, when an electric energy of multi-elements is to be measured, since a balance is corrected by the provision of balance adjustment means, there is an advantage that a measuring precision can be improved.

According to the sixteenth aspect of the present invention, since a measuring error is reduced in the state that no electric energy is entered by the provision of potential operation preventing means, there is an advantage that a measuring precision can be improved.

According to the seventeenth aspect of the present invention, since a potential operation of an output having passed through a third low-pass filter is prevented, a measuring error can be reduced in the state that no electric energy is entered.

According to the eighteenth aspect of the present invention, since light load adjustment means is provided and a predetermined light load adjustment value is added at least when a light load is applied, there is an advantage that a measuring error can be reduced when the light load is applied.

According to the nineteenth aspect of the present invention, since an electric energy is measured at an operating clock frequency f×n, there is an advantage that a measuring precision can be measured in a short time and in particular a measuring precision in a fine current region can be measured in a short time.

According to the twentieth aspect of the present invention, since rating adjustment means is provided and an electric power value corrected by a rated reference value is output, an electric energy can be measured with a high precision.

According to the twenty-first aspect of the present invention, since respective adjustment values are set and stored as digital values, they can be automatically set without the need of manpower, by which an advantage is obtained in that an electronic watt-hour meter can be made by an automated line and its cost can be reduced.

We claim:

1. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, wherein said analog to digital conversion means is a sigma-delta modulation circuit for integrating an analog input value by an integrator and outputting a digital value through a comparator as well as delaying and digital to analog converting said output digital value so that said output digital value is fed back to the input of said integrator and said electronic watt-hour meter comprises switching means for switching a plurality of inputs at a predetermined cycle and successively entering said respective inputs to said sigma-delta modulation circuit and holding means for holding integrated values which are successively integrated by said integrator in synchronism with the switching cycle of said switching means in correspondence with the plurality of said respective inputs, respectively, whereby said integrator successively integrates the plurality of said respective inputs and said holding means successively holds said integrated values, at said predetermined cycle.

2. An electronic watt-hour meter according to claim 1, further comprising thinning-out means for thinning out said quantized AC current and said quantized AC voltage each having been subjected to said moving average processing from the sampled value train thereof at a ratio of 1/n (n≧1).

3. An electronic watt-hour meter according to claim 1, wherein said first analog to digital conversion means and said second analog to digital conversion means include a sigma-delta modulation circuit.

4. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, wherein said first and second moving average processing means have an output of 8 bits or less.

5. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, further comprising first and second integration means for integrating each one cycle of a quantized AC current and a quantized AC voltage, second multiplication means for multiplying outputs from said respective integration means, and subtracting means for subtracting an output from said second multiplication means from an output from said first multiplication means.

6. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, further comprising zero-cross detection means for detecting one cycle of a quantized AC current and a quantized AC voltage by the zero-cross point of said AC voltage, first and second integration means for integrating each one cycle of said quantized AC current and said quantized AC voltage based on an output from said zero-cross detection means, second multiplication means for multiplying outputs from said respective integration means, and subtracting means for subtracting an output from said second multiplication means from an output from said first multiplication means.

7. An electronic watt-hour meter, comprising:

first analog to digital conversion means for quantizing an AC current;

second analog to digital conversion means for quantizing an AC voltage;

first and second digital low-pass filters for causing said quantized AC current and said quantized AC voltage to pass through a low-pass region, respectively;

thinning-out means for thinning out said quantized current and said quantized voltage each having been subjected to said low-pass filtration from the sampled value train thereof at a ratio of 1/m (m: a number larger than the number of delay means of said first and second digital low-pass filters);

first multiplication means for multiplying AC currents and AC voltages from said thinning-out means; and cumulation means for cumulating outputs from said multiplication means, wherein said first and second low-pass filters are filters each having an output of 8 bits or less.

8. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, further comprising an offset adjustment means for subtracting an offset electric power value from a quantized electric power value, wherein an offset electric power is calculated from a quantized offset current and a quantized offset voltage determined by entering a reference current and a reference voltage and the calculation result is set as said offset electric power value.

9. An electronic watt-hour meter, comprising:

switching means for successively fetching AC currents and AC voltages of respective multiple-element inputs of multiple-input devices from input AC currents and AC voltage of the corresponding multiple-element inputs at a predetermined cycle;

first analog to digital conversion means and second analog to digital conversion means for successively quantizing AC currents and AC voltages of said respective multiple-element inputs from said switching means;

first and second digital low-pass filters for causing said quantized AC currents and AC voltages of said respective multiple-element inputs to successively pass through a low-pass region;

thinning-out means for thinning out said quantized currents and voltages of said respective multiple-element inputs each having been subjected to said low-pass filtration from the sampled value train thereof at a ratio of 1/m (m: a number larger than the number of delay means of said first and second digital low-pass filters);

calculation means for multiplying AC currents and AC voltages which correspond to the multiple-element inputs and are supplied from said thinning-out means and determining sums of the multiplication results; and cumulation means for cumulating outputs of said sums, further comprising an offset adjustment means for subtracting an offset electric power value from a quantized electric power value, wherein an offset electric power is calculated from a quantized offset current and a quantized offset voltage determined by entering a reference current and a reference voltage at a predetermined cycle and the result of calculation is set as said offset electric power value at each predetermined cycle.

10. An electronic watt-hour meter, comprising:

first analog to digital conversion means for quantizing an AC current;

second analog to digital conversion means for quantizing an AC voltage;

first and second digital low-pass filters for causing said quantized AC current and said quantized AC voltage to pass through a low-pass region, respectively;

thinning-out means for thinning out said quantized current and said quantized voltage each having been subjected to said low-pass filtration from the sampled value train thereof at a ratio of 1/m (m: a number larger than the number of delay means of said first and second digital low-pass filters);

first multiplication means for multiplying AC currents and AC voltages from said thinning-out means; and cumulation means for cumulating outputs from said multiplication means, further comprising delay means capable of obtaining a desired delay time interposed between said second analog to digital conversion means and said second digital low pass filter, whereby a voltage phase angle is adjusted by delay operation of said delay means.

11. An electronic watt-hour meter according to claim 10, wherein said delay means is a shift register capable of carrying out the desired number of shifts and a phase angle is adjusted by shift operation of said shift register.

12. An electronic watt-hour meter, comprising;

first analog to digital conversion means for quantizing an AC current;

second analog to digital conversion means for quantizing an AC voltage;

first and second digital low-pass filter for causing said quantizing AC current and said quantized AC voltage to pass through a low-pass region, respectively;

thinning-out means for thinning out said quantized current and said quantized voltage each having subjected to said low-pass filtration from the sampled value train thereof at a ratio of 1/m (m: a number larger than the number of delay means of said first and second digital low-pass filters);

first multiplication means for multiplying AC currents and AC voltage from said thinning-out means; and cumulation means for cumulating outputs from said multiplication means, further comprising delay means capable of obtaining a desired delay time interposed between said first analog to digital conversion means and said first digital low pass filter, whereby a current phase angle is adjusted by delay operation of said delay means.

13. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage first multiplication means for multiplying said AC current and said AC voltage each subjected to said moving average processing; and cumulation means for cumulating outputs from said multiplication means, further comprising a balance adjustment means for multiplying quantized electric power values of respective 2, 3, . . . n elements by balance adjustment values B2, B3, Bn in a case of multi-element inputs for entering AC currents and AC voltages of n elements, wherein respective balance adjustment values $B2 = w_1/w_2$, $B3 = w_1/w_3$, . . . $Bn = w_1/w_n$ are set as said balance adjustment values, where quantized electric power values which are quantized by applying a reference current and a reference voltage to inputs of respective first, second, third, . . . n elements are represented by $w_1$, $w_2$, $W_3$, . . . $w_n$.

14. An electronic watt-hour meter, comprising:

first analog to digital conversion means for quantizing an AC current;

second analog to digital conversion means for quantizing an AC voltage;

first and second digital low-pass filters for causing said quantized AC current and said quantized AC voltage to pass through a low-pass region, respectively;

thinning-out means for thinning out said quantized current and said quantized voltage each having been subjected to said low-pass filtration from the sampled value train thereof at a ratio of 1/m (m: a number larger than the number of delay means of said first and second digital low-pass filters);

first multiplication means for multiplying AC currents and AC voltages from said thinning-out means; and cumulation means for cumulating outputs from said multiplication means, further comprising a potential operation preventing means for resetting a cumulated value of quantized electric power values each time said cumulated value exceeds a preset rated reference value to repeat cumulation as well as measuring a time until said cumulated value of said electric power values exceeds said rated reference value, and not measuring electric power values within said measuring time when said time exceeds a predetermined time.

15. An electronic watt-hour meter according to claim 14, further comprising a third digital low-pass filter for causing a quantized electric power value to pass through a low-pass region and an output having passed through said third digital low-pass filter is inputted into said potential operation preventing means.

16. An electronic watt-hour meter, comprising;

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, further comprising a light load adjustment means for adding a predetermined light load adjustment value to a quantized electric power value at least when a light load is applied.

17. An electronic watt-hour meter, comprising:

first analog to digital conversion means for quantizing an AC current;

second analog to digital conversion means for quantizing an AC voltage;

first and second digital low-pass filters for causing said quantized AC current and said quantized AC voltage to pass through a low-pass region, respectively;

thinning-out means for thinning out said quantized current and said quantized voltage each having been subjected to said low-pass filtration from the sampled value train thereof at a ratio of 1/m (m: a number larger than the number of delay means of said first and second digital low-pass filters);

first multiplication means for multiplying AC currents and AC voltages from said thinning-out means; and cumulation means for cumulating outputs from said multiplication means, further comprising:
- a third digital low-pass filter operating at a predetermined clock cycle frequency f and causing a quantized electric power value to pass through a low-pass region;
- a first register for storing an output value having passed through said third digital low-pass filter;
- a second register for operating at an operating clock frequency f×n and adding a value of said first register n times and storing a resulting value; and
- comparison means for comparing a value output from said second register with a preset rated reference value at the operating clock cycle f×n and sending an output for calculating an electric energy each time a compared result exceeds said rated reference value.

18. An electronic watt-hour meter, comprising:

first analog to digital conversion means for quantizing an AC current in synchronism with time;

second analog to digital conversion means for quantizing an AC voltage in synchronism with time;

first and second moving average processing means for determining a moving average of each of said quantized AC current and said quantized AC voltage;

first multiplication means for multiplying said AC current and said AC voltage each subjected to said moving average processing; and cumulation means for cumulating outputs from said multiplication means, further comprising rating adjustment means for outputting an entered electric energy as an electric energy corrected based on a rated reference value, wherein a previously set rated reference value is corrected in accordance with a ratio of a reference electric power value obtained in an actual measurement by inputting a reference current and a reference voltage to a reference electric power value calculated by multiplying said reference current by said reference voltage and the corrected rated reference value is set as said rated reference value.

19. An electronic watt-hour meter, comprising:

switching means for successively switching at a predetermined cycle and outputting respective currents and voltages entered from a first phase, a second phase and a third phase;

first and second analog to digital conversion means for quantizing AC currents and AC voltages of said respective phases output from said switching means, respectively;

first and second digital low-pass filters for causing said quantized AC currents and AC voltages of said respective phases to pass through a low-pass region, respectively;

thinning-out means for thinning out said quantized AC currents and AC voltages of said respective phases each having been subjected to said low-pass filtration from the sampled value train thereof at a ratio of 1/m;

multiplication means for multiplying said AC currents of said respective phases by said AC voltages of said respective phases each output from said thinning means, respectively;

addition means for determining sums of outputs from said multiplication means;

a third low-pass filter for causing said added outputs to pass through a low-pass region;

cumulating means for cumulating outputs from said third digital low-pass filter; as well as at least one of the following adjustment means:

(1) balance adjustment means including first and second balance adjustment registers for multiplying quantized electric power values of a second phase and a third phase determined from an AC current and an AC voltage of a usual object to be measured by balance adjustment value B1, B2, respectively and setting a value $B2=w_{O1}/w_{O2}$ to said first balance adjustment register and setting a value $B3=w_{O1}/w_{O3}$ to said second balance adjustment register, where an output from said third digital low-pass filter is represented by $w_{o1}$ at the time when a predetermined analog value of the same phase is input as a current-voltage value of the first phase, said analog value is input as a current-voltage value of the second phase and an output from said third digital low-pass filter at the time is represented by $W_{O2}$, and said analog value is input as a current-voltage value of the first phase and an output from said third digital low-pass filter at the time is represented by $w_{o3}$;

(2) rating adjustment means including a register for cumulating outputs from said third digital low-pass filter and an F value setting register for setting a value F=($w_{O1}$/reference electric power)×(rated reference value) (where, reference electric power= product in calculation determined by multiplying reference voltage-reference current, and rated reference value=value in calculation for determining the number of pulses per unit of electric energy (constant), and sending an output for measuring an electric energy each time said cumulated value exceeds said F value as well as resetting said register;

(3) light load adjustment means including a light load adjustment register for adding a set light load adjustment value to an output value from said third digital low-pass filter and setting a value $L=(w_{O1}/nm)-w_{On}$ to said light load adjustment register as a light load adjustment value, where an output from said digital low-pass filter is represented by wo@ at the time when a value of 1/n (n≧1) a current analog value entered in said (1) is entered as a current input of the first phase as well as a value of 1/m (m≧1) a voltage analog value entered in said (1) is entered as a voltage input of the second phase; and (4) phase adjustment means including a shift register capable of carrying out the desired number of shifts interposed between said second analog to digital conversion means and said second digital low-pass filter and respective registers P1, P2, P3 for designating the number of shifts of said shift register and carrying out phase adjustment by successively shifting respective phases to values P1, P2, P3 by said shift register in synchronism with said switching means, where an output from said third low-pass filter is represented by $w_{OP1}$ at the time when an analog value having the same effective value as that of the analog value of the (1) and a power factor=1 is input as an input of the first phase and a value $P1=K(w_{O1}\times 0.5)-w_{O1}$ (K: constant) is set to said P1 shift register, an output from said third low-pass filter is represented by $w_{OP2}$ at the time when an analog value having the same effective value as that of the analog value of the (1) and a power factor=1 is input as an input of the second phase and a value $P2=K(w_{O1}\times 0.5)-w_{OP2}$ is set to said P1 shift register, and an output from said third low-pass filter is represented by $w_{OP3}$ at the time when an analog value having the same effective value as that of the analog value of the (1) and a power factor=1 is input as an input of the second phase and a value $P3=K(w_{O1}\times 0.5)-[W]w_{OP3}$ is set to said P1 shift register.

* * * * *